(12) United States Patent
Lee et al.

(10) Patent No.: US 11,264,596 B2
(45) Date of Patent: Mar. 1, 2022

(54) ELECTRONIC DEVICE WITH A SUBSTRATE HAVING AN OPENING REGION INCLUDING A RECESSED REGION

(71) Applicant: Samsung Display Co., Ltd., Yongin-si (KR)

(72) Inventors: Che ho Lee, Seoul (KR); Jaehyun Kim, Suwon-si (KR); Daesang Yun, Cheongju-si (KR); Soyeon Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/834,338

(22) Filed: Mar. 30, 2020

(65) Prior Publication Data

US 2020/0343481 A1  Oct. 29, 2020

(30) Foreign Application Priority Data

Apr. 29, 2019  (KR) .......................... 10-2019-0049695

(51) Int. Cl.
  *H01L 51/52* (2006.01)
  *H01L 51/00* (2006.01)
  *H01L 27/32* (2006.01)

(52) U.S. Cl.
  CPC ...... *H01L 51/5253* (2013.01); *H01L 27/3244* (2013.01); *H01L 51/0096* (2013.01); *H01L 2251/301* (2013.01); *H01L 2251/303* (2013.01)

(58) Field of Classification Search
  CPC ............. H01L 51/5253; H01L 51/0096; H01L 27/3244; H01L 2251/301
  See application file for complete search history.

(56) References Cited

U.S. PATENT DOCUMENTS

| | | |
|---|---|---|
| 9,632,487 B2 | 4/2017 | Kim et al. |
| 10,199,448 B2 | 2/2019 | Kim et al. |
| 10,332,947 B2 | 6/2019 | Kim et al. |

(Continued)

FOREIGN PATENT DOCUMENTS

| | | |
|---|---|---|
| CN | 110137370 A | 8/2019 |
| JP | 2019-133935 A | 8/2019 |

(Continued)

*Primary Examiner* — Ida M Soward
(74) *Attorney, Agent, or Firm* — Lewis Roca Rothgerber Christie LLP

(57) ABSTRACT

An electronic device includes a base substrate including a hole region including a recessed region and a display, a circuit device layer including insulating layers, each of which has an opening overlapped with the recessed region, a display element layer including an organic light emitting element including a charge control layer, which is between first and second electrodes and is overlapped with the display and hole regions, an encapsulation layer including first and second inorganic encapsulation layers and an organic encapsulation layer therebetween, and a protection inorganic layer between the insulating layers and first inorganic encapsulation layer. The charge control layer may include a first pattern on one of the insulating layers overlapped with the hole region and a second pattern spaced apart from the first pattern and in the recessed region. The protection inorganic layer may cover the first pattern and the second pattern.

21 Claims, 23 Drawing Sheets

(56) References Cited

U.S. PATENT DOCUMENTS

| | | | |
|---|---|---|---|
| 10,446,786 B2* | 10/2019 | Sung | H01L 51/56 |
| 10,454,067 B2* | 10/2019 | Seo | H01L 27/3251 |
| 10,461,268 B2* | 10/2019 | Jiang | H01L 27/3258 |
| 10,553,819 B2* | 2/2020 | Kim | H01L 27/3246 |
| 10,566,394 B2* | 2/2020 | Cai | H01L 51/5253 |
| 10,615,369 B2* | 4/2020 | Choi | H01L 27/3262 |
| 10,673,020 B2 | 6/2020 | Kim | |
| 10,756,156 B2* | 8/2020 | Sung | H01L 51/5284 |
| 10,804,348 B2* | 10/2020 | Kim | H01L 27/3246 |
| 10,840,478 B2* | 11/2020 | Han | H01L 27/3262 |
| 10,903,293 B2* | 1/2021 | Jeong | H01L 27/323 |
| 10,909,930 B2* | 2/2021 | Kim | H01L 27/3276 |
| 10,957,874 B2* | 3/2021 | Kim | H01L 27/3246 |
| 10,971,574 B2* | 4/2021 | Sung | H01L 27/3258 |
| 11,075,362 B2* | 7/2021 | Seo | H01L 51/5256 |
| 2018/0183015 A1 | 6/2018 | Yun et al. | |
| 2019/0081273 A1* | 3/2019 | Sung | H01L 51/52 |
| 2019/0157606 A1* | 5/2019 | Odaka | H01L 51/5209 |
| 2019/0157609 A1* | 5/2019 | Suzuki | H01L 51/5246 |
| 2019/0245159 A1 | 8/2019 | Kim et al. | |
| 2019/0334120 A1* | 10/2019 | Seo | H01L 51/5246 |
| 2019/0355930 A1* | 11/2019 | Lee | H01L 51/5253 |
| 2020/0064968 A1* | 2/2020 | Kim | G06F 3/0445 |
| 2020/0119131 A1* | 4/2020 | Ohara | G09F 9/30 |
| 2021/0151715 A1* | 5/2021 | Lee | H01L 27/3258 |

FOREIGN PATENT DOCUMENTS

| | | |
|---|---|---|
| KR | 10-2017-0015632 A | 2/2017 |
| KR | 10-2018-0002126 A | 1/2018 |
| KR | 10-2018-0026599 A | 3/2018 |
| KR | 10-2018-0076429 A | 7/2018 |
| KR | 10-2019-0094269 A | 8/2019 |
| KR | 10-2020-0003328 A | 1/2020 |
| KR | 10-2020-0026381 A | 3/2020 |
| KR | 10-2020-0036130 A | 4/2020 |

* cited by examiner

ELECTRONIC DEVICE WITH A SUBSTRATE HAVING AN OPENING REGION INCLUDING A RECESSED REGION

CROSS-REFERENCE TO RELATED APPLICATION

This application claims priority to and the benefit of Korean Patent Application No. 10-2019-0049695, filed on Apr. 29, 2019, in the Korean Intellectual Property Office (KIPO), the entire contents of which is incorporated herein by reference.

BACKGROUND

The present disclosure relates to an electronic device, and in particular, to a reliable electronic device.

A display panel is activated by an electrical signal and is used to display an image. The display panel includes an organic light emitting display panel with an organic light emitting element. The organic light emitting display panel has low power consumption, high brightness, and high reaction speed.

The organic light emitting display panel includes organic light emitting elements. An organic light emitting element is vulnerable to moisture or oxygen and is easily damaged by the moisture or oxygen. Thus, to improve reliability and life span characteristics of the organic light emitting display panel, it is desirable to stably prevent or substantially prevent the organic light emitting element from being exposed to an external moisture or oxygen.

SUMMARY

Aspects of some embodiments of the inventive concept are directed to an electronic device, which exhibits good resistance against an external impact and prevents or reduces inflow of a contamination material (e.g., external oxygen and moisture).

According to some embodiments of the inventive concept, an electronic device may include a base substrate including a hole region, a display region, and a peripheral region, a circuit device layer including a transistor and a plurality of insulating layers, a display element layer on the circuit device layer, an encapsulation layer on the display element layer, a protection inorganic layer in the hole region and between the insulating layers and the first inorganic encapsulation layer, and a module hole overlapped with the hole region. The display region may enclose the hole region, and the peripheral region may be adjacent to the display region. The hole region may include a recessed region, at which at least a portion of the base substrate is recessed. The transistor may be on the base substrate, and each of the plurality of insulating layers may have an opening overlapped with the recessed region. The display element layer may include an organic light emitting element, which includes a first electrode connected to the transistor, a second electrode opposite to the first electrode, a light emitting pattern in the display region, and a charge control layer between the first and second electrodes and overlapped with the display and hole regions. The encapsulation layer may include a first inorganic encapsulation layer, a second inorganic encapsulation layer, and an organic encapsulation layer between the first inorganic encapsulation layer and the second inorganic encapsulation layer. The module hole may be spaced apart from the recessed region and may be defined to penetrate each of the base substrate, at least a portion of the insulating layers, the protection inorganic layer, a first pattern, the first inorganic encapsulation layer, and the second inorganic encapsulation layer. The charge control layer may include an organic pattern overlapped with the light emitting pattern, the first pattern, which is on one of the insulating layers overlapped with the hole region, and a second pattern, which is spaced apart from the first pattern and is disposed in the recessed region. The protection inorganic layer may cover the first pattern and the second pattern.

In some embodiments, the protection inorganic layer may be covered with the first inorganic encapsulation layer.

In some embodiments, the first inorganic encapsulation layer and the second inorganic encapsulation layer may include different materials from each other, and the protection inorganic layer may include the same material as the second inorganic encapsulation layer.

In some embodiments, the protection inorganic layer may include silicon nitride ($SiN_x$), and the first protection inorganic layer may include silicon oxynitride ($SiO_xN_y$).

In some embodiments, the protection inorganic layer may have a relatively low oxidation rate, compared with the first inorganic encapsulation layer.

In some embodiments, the protection inorganic layer may not be overlapped with the display region and may be spaced apart from the light emitting pattern, when viewed in a plan view.

In some embodiments, the second pattern may expose at least a portion of the recessed region, and the protection inorganic layer may cover the portion of the recessed region exposed by the second pattern.

In some embodiments, the electronic device may further include a second groove a first groove which is formed by covering an inner surface of each of the opening and an inner surface of the recessed region with the protection inorganic layer, the first inorganic encapsulation layer, and the second inorganic encapsulation layer.

In some embodiments, the electronic device may further include a second groove, which is spaced apart from the module hole with the first groove interposed therebetween, is formed by recessing a portion of the base substrate from a top surface of at least one of the insulating layers, and is covered with the protection inorganic layer and the first inorganic encapsulation layer. The second groove may be an internal space filled with the organic encapsulation layer.

In some embodiments, the electronic device may further include a dam portion, which is disposed in at least one of regions between the first groove and the module hole and between the first groove and the second groove. The dam portion may include the same material as one of the insulating layers.

In some embodiments, the first groove may have a closed-line shape enclosing the module hole.

In some embodiments, the first groove and the module hole may have different shapes from each other, when viewed in a plan view.

In some embodiments, the recessed region may include a bottom region and a side region connected to the bottom region. The side region may include a curved surface, whose distance from the insulating layers is non-linearly (or irregularly) changed in a thickness direction of the base substrate.

In some embodiments, at least one of the insulating layers, which is overlapped with the recessed region in a plan view and protrudes from the recessed region, may to be a tip portion. The tip portion may be covered with the protection inorganic layer.

In some embodiments, the electronic device may further include an electronic module, which is overlapped with the module hole and is below the base substrate. The electronic module may include at least one of a sound output module, a light-emitting module, a light-receiving module, or a camera module.

According to some embodiments of the inventive concept, an electronic device may include a base substrate including a hole region, a display region enclosing the hole region, and a peripheral region adjacent to the display region, the hole region including a recessed region, in which at least a portion of the base substrate is recessed, a plurality of insulating layers on the base substrate, each of the insulating layers having an opening, which is defined in the hole region and is overlapped with the recessed region, a pixel between the insulating layers, the pixel including an organic light emitting element including a first electrode, a second electrode opposite to the first electrode, a light emitting pattern in the display region, and a charge control layer, which is between the first electrode and the second electrode and is overlapped with the display region and the hole region, an encapsulation layer including a first inorganic encapsulation layer covering the pixel, a second inorganic encapsulation layer opposite to the first inorganic encapsulation layer, and an organic encapsulation layer between the first inorganic encapsulation layer and the second inorganic encapsulation layer, and a protection inorganic layer in the hole region and between the insulating layers and the first inorganic encapsulation layer. The charge control layer may include an organic pattern overlapped with the light emitting pattern, a first pattern on one of the insulating layers overlapped with the hole region, and a second pattern spaced apart from the first pattern and in the recessed region. The protection inorganic layer may be covered with the first inorganic encapsulation layer.

In some embodiments, the protection inorganic layer may cover the first pattern and the second pattern.

In some embodiments, the first inorganic encapsulation layer and the second inorganic encapsulation layer may include different materials from each other, and the protection inorganic layer may include the same material as the second inorganic encapsulation layer.

In some embodiments, the protection inorganic layer may not be overlapped with the display region and may be spaced apart from the light emitting pattern, when viewed in a plan view.

In some embodiments, the electronic device may further include a second groove a first groove which is formed by covering an inner surface of each of the opening and an inner surface of the recessed region with the protection inorganic layer, the first inorganic encapsulation layer, and the second inorganic encapsulation layer.

In some embodiments, the electronic device may further include a module hole, which is overlapped with the hole region, is spaced apart from the recessed region, and penetrates each of the base substrate, at least a portion of the insulating layers, the protection inorganic layer, the first pattern, the first inorganic encapsulation layer, and the second inorganic encapsulation layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
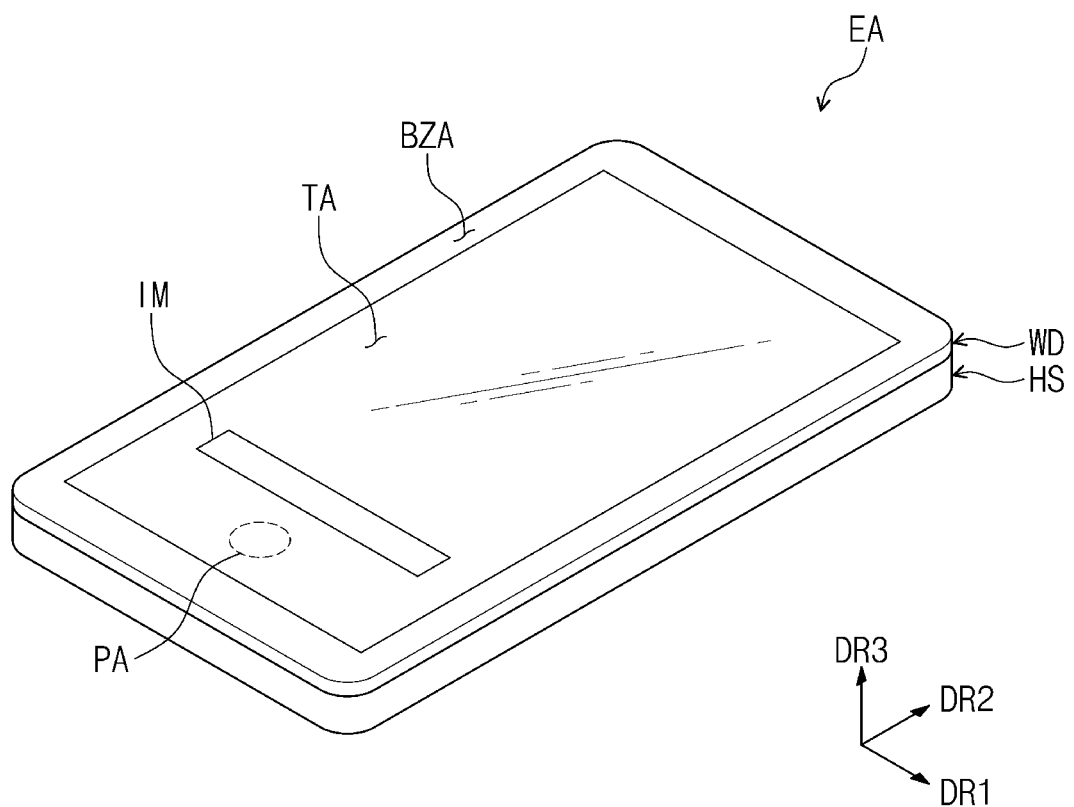
FIG. 1 is a perspective view illustrating an electronic device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concept will now be described more fully with reference to the accompanying drawings, in which example embodiments are shown. Example embodiments of the inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

Expressions such as "at least one of", "one of" or "selected from" when preceding a list of elements, modify the entire list of elements and do not modify the individual elements of the list. Further, the use of "may" when describing embodiments of the present invention refers to "one or more embodiments of the present invention." It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
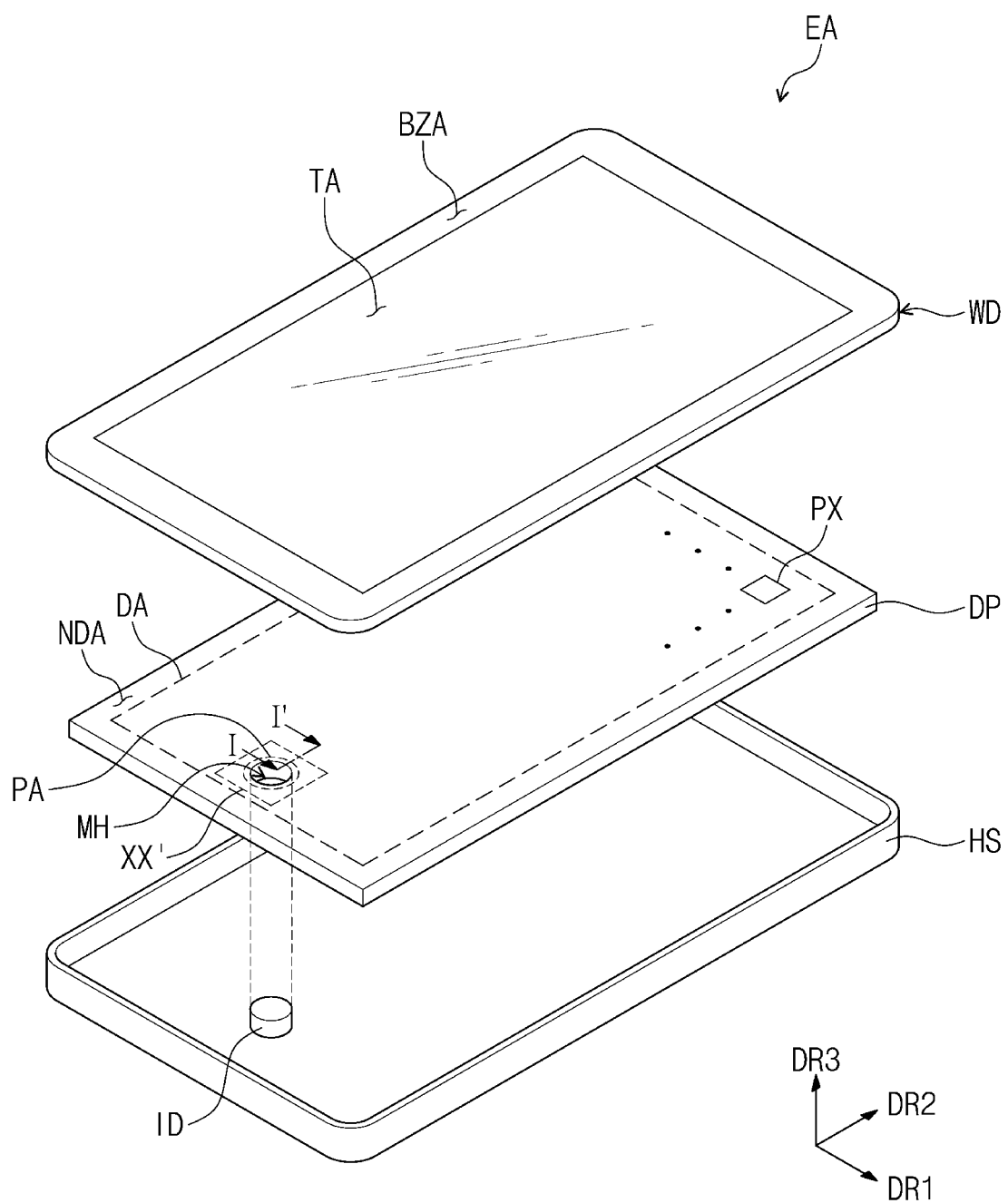
FIG. 2 is an exploded perspective view of the electronic device shown in FIG. 1.
Figure 3:
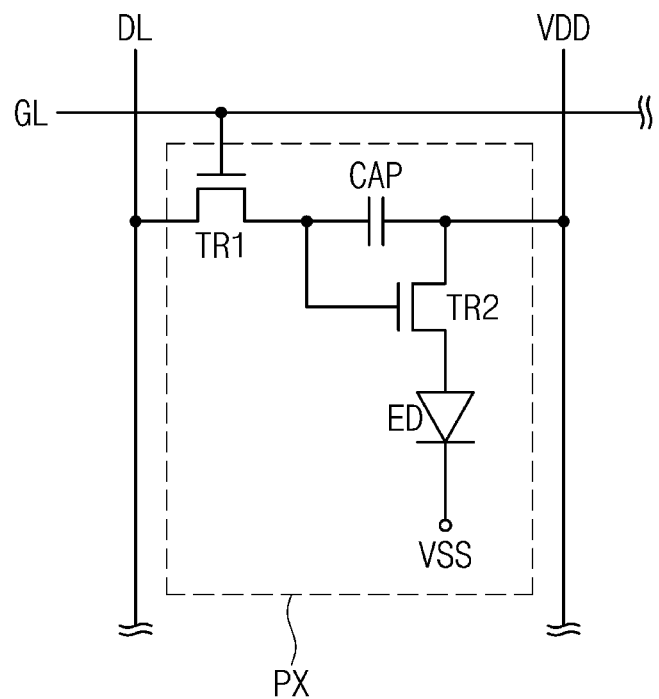
FIG. 3 is an equivalent circuit diagram of a pixel shown in FIG. 1.
Figure 4:
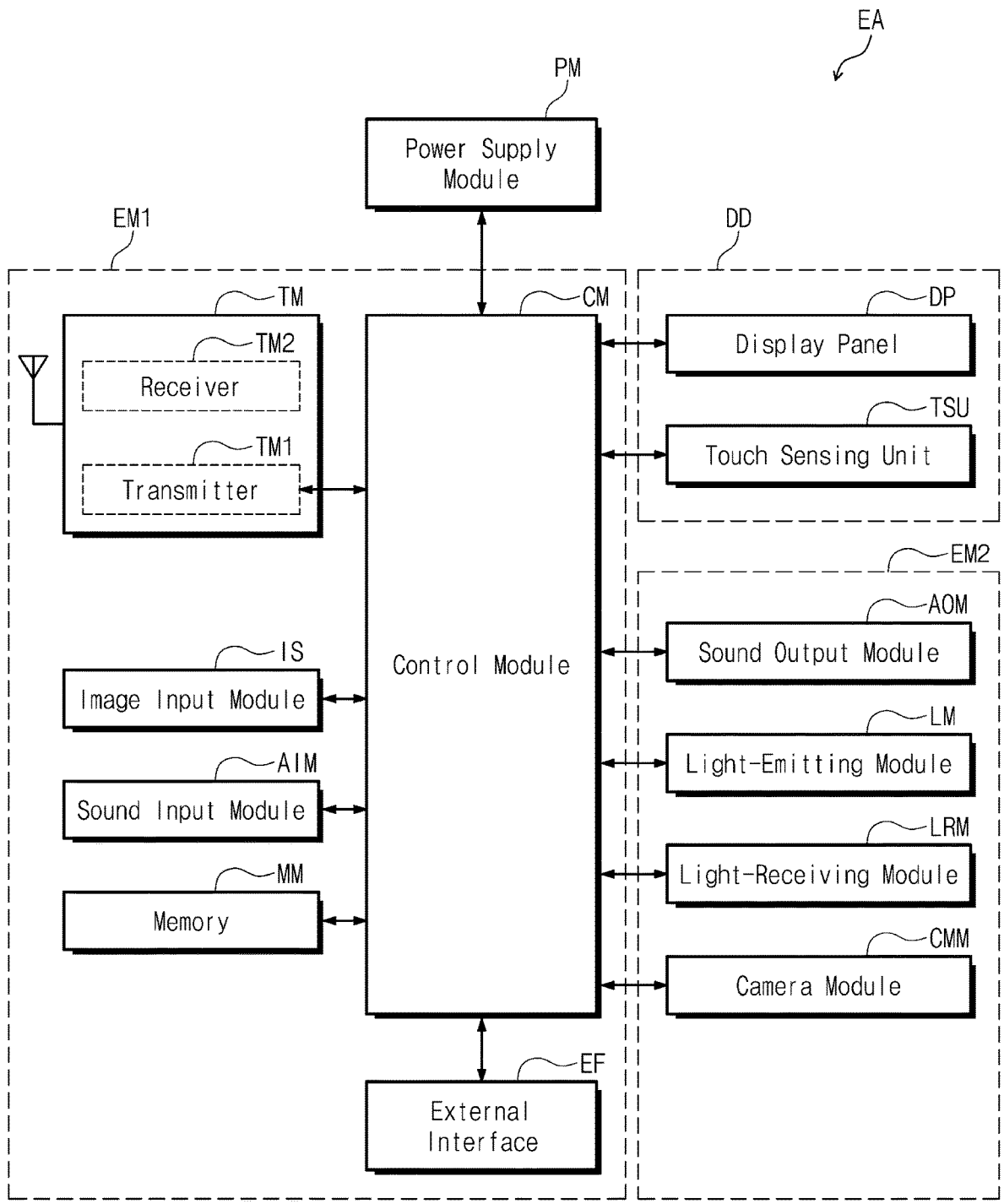
FIG. 4 is a block diagram of the electronic device shown in FIG. 1.

FIG. 1 is a perspective view illustrating an electronic device according to some embodiments of the inventive concept. FIG. 2 is an exploded perspective view of the electronic device shown in FIG. 1. FIG. 3 is an equivalent circuit diagram of a pixel shown in FIG. 1. FIG. 4 is a block diagram of the electronic device shown in FIG. 1. Hereinafter, an electronic device according to some embodiments of the inventive concept may be described with reference to FIGS. 1-4.

Referring to FIGS. 1 and 2, an electronic device EA may include a front surface, which is used to display an image IM and serves as a display surface. The display surface may be defined to be parallel to a first direction DR1 and a second direction DR2. The display surface may include a transmission region TA and a bezel region BZA adjacent to the transmission region TA.

The electronic device EA may display the image IM on the transmission region TA, which is included in a window member WD. In FIG. 1, an internet search window is illustrated as an example of the image IM. The transmission region TA may have a tetragonal or rectangular shape, whose sides are parallel to the first direction DR1 and the second direction DR2. However, the inventive concept is not limited to this example, and in some embodiments, the shape of the transmission region TA may be suitably changed in a various manner.

Hereinafter, a direction that is normal to the display surface will be referred to as a thickness direction of the electronic device EA or a third direction DR3. In the present specification, a front or top surface and a rear or bottom surface of each element may be distinguished from each other, based on the third direction DR3 or a display direction of the image IM. For example, the front and rear surfaces may be two opposite surfaces facing each other (or facing away from each other) in the third direction DR3.

In the present specification, directions indicated by the first to third directions DR1, DR2, and DR3 may be relative to each other, and in certain embodiments, they may be used to indicate other directions. Hereinafter, first to third directions may be directions indicated by the first to third directions DR1, DR2, and DR3, respectively, and will be referenced with the same numerals.

The electronic device EA may include a display panel DP, a window member WD, an electronic module ID, a module hole MH, and a housing member HS. As shown in FIG. 4, the electronic device EA may further include a display module DD, a first electronic module EM1, a second electronic module EM2, and a power supply module PM. For convenience of illustration, some of elements illustrated in FIG. 4 may be omitted from FIG. 2.

The display panel DP may include a display region DA, in which a hole region PA is included, and a peripheral region NDA. The display region DA may be used to generate and display the image IM. For example, a plurality of pixels PX, which are used to generate light for the image IM, may be disposed in the display region DA. The peripheral region NDA may be adjacent to the display region DA. The peripheral region NDA may enclose (e.g., surround) the display region DA. A driving circuit or a driver line for driving the display region DA may be disposed in the peripheral region NDA.

In some embodiments, a portion of the peripheral region NDA of the display panel DP may be curved or bent. For example, a portion of the peripheral region NDA may be disposed to face the front surface of the electronic device EA, and/or another portion of the peripheral region NDA may be disposed to face a rear surface of the electronic device EA. In some embodiments, the peripheral region NDA may be omitted from the display panel DP. In some embodiments, the display region DA may be overlapped with the transmission region TA, and the peripheral region NDA may be overlapped with the bezel region BZA.

FIG. 3 shows an equivalent circuit diagram of one of the pixels PX. Referring to FIG. 3, the pixel PX may be connected to a plurality of signal lines. In the present embodiment, a gate line GL, a data line DL, and a power line VDD are illustrated as an example of the signal lines. However, the inventive concept is not limited to this example, and in some embodiments, the pixel PX may be further connected to other signal lines.

The pixel PX may include a first transistor TR1, a capacitor CAP, a second transistor TR2, and an organic light emitting element ED. The first transistor TR1 may be a switching device controlling an on/off state of the pixel PX. The first transistor TR1 may transmit or block a data signal, which is transmitted through the data line DL, in response to a gate signal transmitted through the gate line GL.

The capacitor CAP may be disposed between and connected to the first transistor TR1 and the power line VDD. The capacitor CAP may be charged to store a charge amount corresponding to a difference in voltage level between the data signal transmitted from the first transistor TR1 and a first power voltage applied to the power line VDD.

The second transistor TR2 may be connected to the first transistor TR1, the capacitor CAP, and the organic light emitting element ED. The second transistor TR2 may control a driving current flowing through the organic light emitting element ED, depending on an amount of electric charges stored in the capacitor CAP. A length or duration in time of a turn-on period of the second transistor TR2 may be dependent on an amount of electric charges stored in the capacitor CAP. During the turn-on period, the second transistor TR2 may provide the first power voltage, which is transmitted through the power line VDD, to the organic light emitting element ED.

The organic light emitting element ED may be connected to the second transistor TR2 and a power terminal VSS. The organic light emitting element ED may emit light whose intensity is determined by a difference in voltage level between a signal transmitted through the second transistor TR2 and a second power voltage received through the power terminal VSS. A light-emitting operation of the organic light emitting element ED may be executed during a turn-on period of the second transistor TR2.

The organic light emitting element ED may include a light-emitting material. The organic light emitting element ED may generate light, whose color is determined by the light-emitting material. Color of light generated by the organic light emitting element ED may be one of red, green, blue, and white.

Referring back to FIG. 2, the hole region PA included in the display region DA may be enclosed by the display region DA. The hole region PA may be disposed adjacent to the module hole MH. In some embodiments, the hole region PA may enclose the module hole MH. As shown in FIG. 2, the hole region PA may be disposed in a side region of the display region DA, but the inventive concept is not limited to this example. In some embodiments, a position of the hole region PA may be suitably changed in a various manner, depending on a position of the module hole MH.

The module hole MH may be overlapped with the hole region PA (e.g., the module hole MH may be in the hole region PA). The module hole MH may be overlapped with the electronic module ID (e.g., the electronic module ID may be aligned with the module hole MH in the third direction DR3). Thus, the electronic module ID may be inserted into the module hole MH. In addition, the electronic module ID may be disposed on a rear surface of the display panel DP adjacent to the module hole MH, and a part of the electronic module ID may be exposed to the outside through the module hole MH. For example, only a lens, which is a part of a camera module CMM, may be exposed to the outside through the module hole MH. In addition, the electronic module ID may be disposed on a rear surface of the display panel DP and may be spaced apart from the display panel DP, when viewed in a sectional view.

The module hole MH may be a hole, which is defined to penetrate at least one, which is overlapped with the hole region PA, of the elements constituting the display panel DP. This may be described in more detail below.

In some embodiments, because the display panel DP includes the module hole MH formed in the display region DA, there is no need to provide an additional space for the electronic module ID in a region outside the display region DA such as the peripheral region NDA. Thus, it may be possible to reduce an area for the peripheral region NDA and to realize or to provide an electronic device EA with a narrow bezel. Furthermore, in the case where the electronic module ID is provided within the module hole MH, it may be possible to reduce a thickness of the electronic device EA.

The window member WD may be used to define the front surface of the electronic device EA. The window member WD may be disposed on the front surface of the display panel DP to protect the display panel DP. For example, the window member WD may include a glass substrate, a sapphire substrate, and/or a plastic film.

The window member WD may have a single-layer or multi-layer structure. For example, the window member WD may have a stack structure including a plurality of plastic films, which are coupled to each other by an adhesive layer, or may have a stack structure including a glass substrate and a plastic film, which are coupled to each other by an adhesive layer.

Because the window member WD includes a transparent material, the window member WD may provide or define the transmission region TA and the bezel region BZA of the electronic device EA. For example, the transparent material of the window member WD may correspond to the transmission region TA. In the present embodiment, the transmission region TA may be a region corresponding to the display region DA. For example, the transmission region TA may be overlapped with the entire front surface of the display region DA or at least a region of the front surface of the display region DA. The image IM displayed on the display region DA of the display panel DP may be provided to an external user through the transmission region TA.

The housing member HS may be coupled with the window member WD. The housing member HS may be provided to define the rear surface of the electronic device EA. The housing member HS may be coupled to the window member WD to define an internal space or an internal volume. The display panel DP, the electronic module ID, and/or several other elements illustrated in FIG. 4 may be contained (or located) in the internal space.

The housing member HS may include a material having a relatively high strength. For example, the housing member HS may include a plurality of frames and/or plates, each of which is formed of at least one of glass, plastic, or metallic materials. The housing member HS may protect the elements of the electronic device EA, which are contained in the internal space, from an external impact.

Referring to FIG. 4, the power supply module PM may supply an electric power to the electronic device EA. The power supply module PM may include a typical battery module.

The electronic module ID may include various functional modules, which are used to operate the electronic device EA. The electronic module ID may include the first electronic module EM1 and the second electronic module EM2.

The first electronic module EM1 may be mounted (e.g., directly mounted) on a motherboard, which is connected (e.g., electrically connected) to the display module DD. Alternatively, the first electronic module EM1 may be mounted on another substrate and may be connected (e.g., electrically connected) to the motherboard through a connector.

The first electronic module EM1 may include a control module CM, a wireless communication module TM, an image input module IS, a sound input module AIM, a memory MM, and an external interface EF. At least one of the modules may not be mounted on the motherboard and may be connected (e.g., electrically connected) to the motherboard through a flexible circuit board.

The control module CM may control overall operations of the electronic device EA. The control module CM may be, for example, a microprocessor. In some embodiments, the display module DD may be activated or inactivated (deactivated) under the control of the control module CM. The control module CM may control other modules, such as the image input module IS or the sound input module AIM, based on touch signals received from the display module DD.

The wireless communication module TM may transmit and receive a wireless signal to and from another terminal via a Bluetooth or a Wi-Fi line. The wireless communication module TM may transmit and receive a voice signal via a typical communication line. The wireless communication module TM may include a transmitter TM1, which modulates and transmits a signal to be transmitted, and a receiver TM2, which receives and demodulates the received signal.

The image input module IS may process an image signal and convert it into image data that can be displayed on the display module DD.

The sound input module AIM may receive an external sound signal, which is obtained by a microphone in a recording mode, a voice recognition mode, and so forth, and then convert it into electrical voice data.

The memory MM may store data, which are received from the wireless communication module TM, the image input module IS, and the sound input module AIM and may be used in a subsequent operation. After the data is used, the data may be deleted from the memory MM. Furthermore, data desirable to control the second electronic module EM2 may be stored in or removed from the memory MM.

The external interface EF may serve as an interface that is connected to an external charger, a wired/wireless data port, a card socket (e.g., a memory card or a SIM/UIM card), and so forth.

The second electronic module EM2 may include a sound output module AOM, a light-emitting module LM, a light-receiving module LRM, and a camera module CMM. The modules of the second electronic module EM2 may be mounted (e.g., directly mounted) on a motherboard. Alternatively, the modules of the second electronic module EM2 may be mounted on another substrate and may be connected (e.g., electrically connected) to the display module DD or the first electronic module EM1 through a connector.

The sound output module AOM may convert sound data, which may be transmitted from the wireless communication module TM or may be stored in the memory MM, and may output the converted sound data to the outside.

The light-emitting module LM may generate and emit light. In some embodiments, the light-emitting module LM may emit infrared light. The light-emitting module LM may include an LED device. The light-receiving module LRM may sense the infrared light. The light-receiving module LRM may be activated, when an infrared light to be incident thereto has an intensity higher (or greater) than a reference value. The light-receiving module LRM may include a CMOS sensor. The infrared light emitted from the light-emitting module LM may be reflected by an external object (e.g., a user's finger or face) and may be incident into the light-receiving module LRM. The camera module CMM may be used to obtain an image of the external object.

The electronic module ID of FIG. 2 may be or may include at least one of the elements constituting the second electronic module EM2. In this case, other elements of the first electronic module EM1 and the second electronic module EM2 may be disposed at other positions. For example, the electronic module ID may include at least one of the sound output module AOM, the light-emitting module LM, the light-receiving module LRM, and the camera module CMM.

Figure 5A:
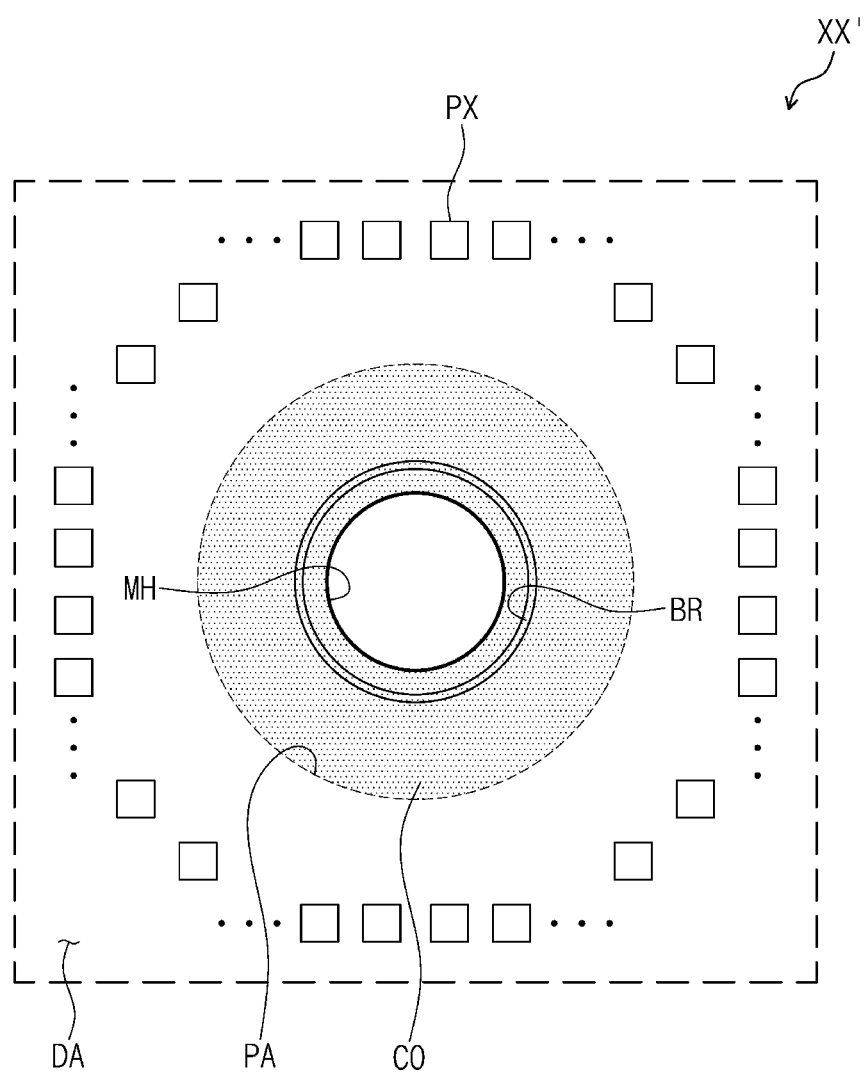
FIG. 5A is an enlarged view of a portion XX' of FIG. 2.
Figure 5B:
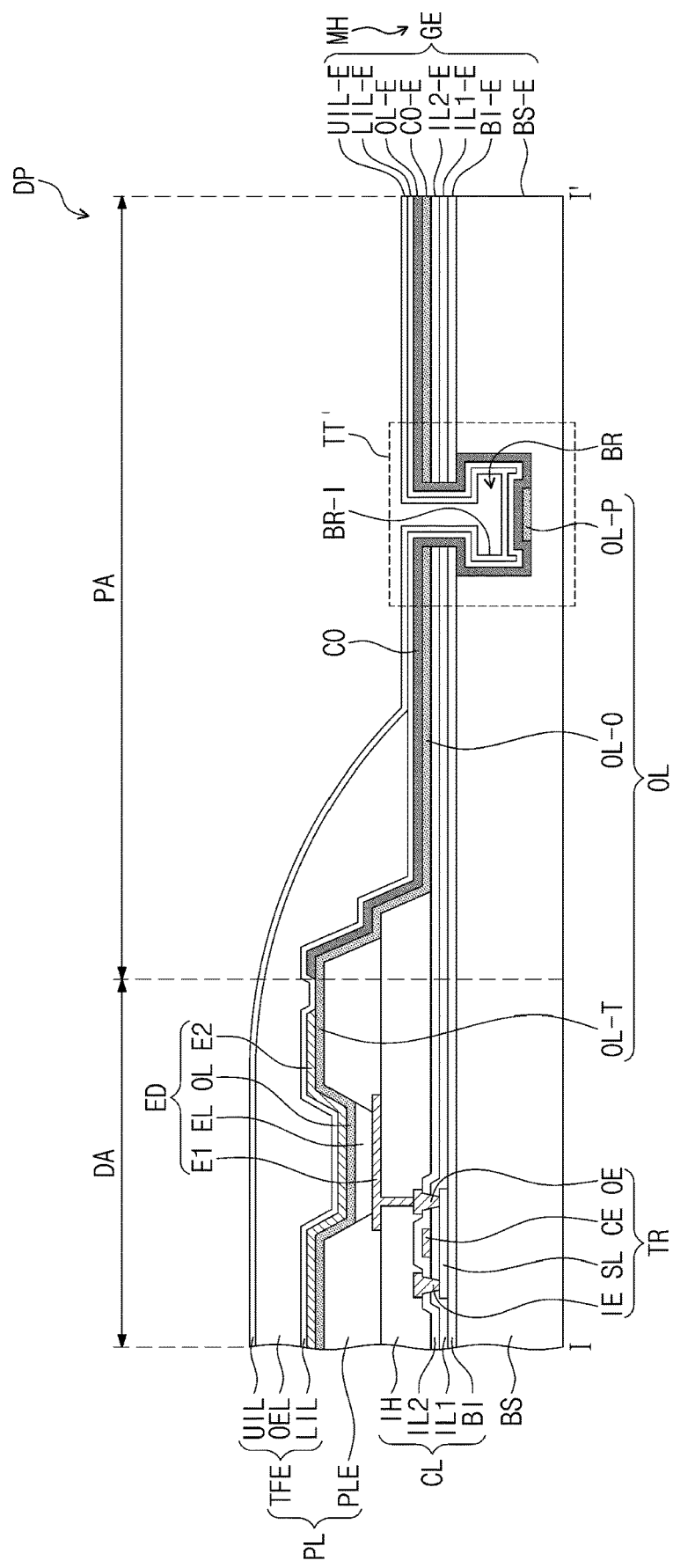
FIG. 5B is a region of a display panel, taken along the line I-I' of FIG. 2.
Figure 5C:
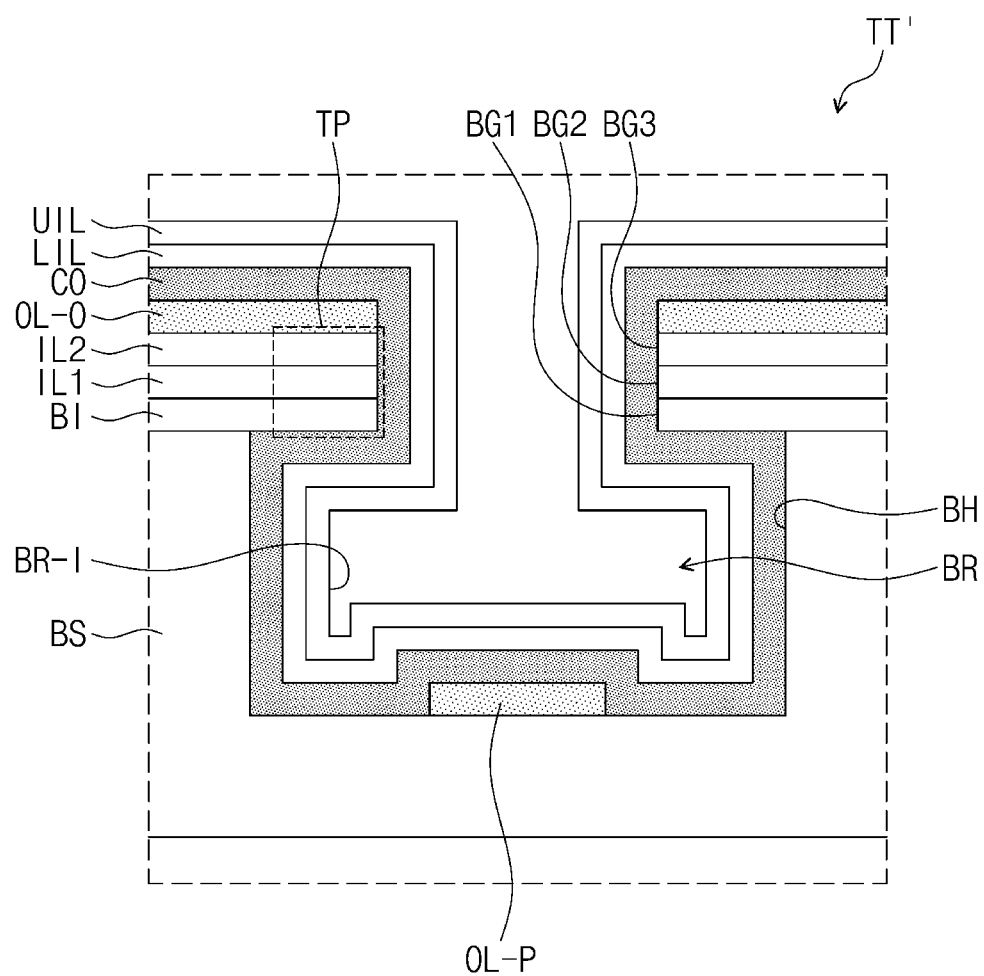
FIG. 5C is an enlarged view of a portion TT' shown in FIG. 5B.

FIG. 5A is an enlarged view of a portion XX' of FIG. 2. FIG. 5B is a region of a display panel, taken along a line I-I' of FIG. 2. FIG. 5C is an enlarged view of a portion TT' shown in FIG. 5B.

Referring to FIGS. 5A and 5B, the hole region PA may be defined in the display region DA. The hole region PA may be enclosed or surrounded by the display region DA. In some embodiments, the hole region PA may be a region including the module hole MH and a groove BR. In some embodiments, the hole region PA may enclose or surround the groove BR and may have a circular or elliptical shape.

In some embodiments, the groove BR may be overlapped with the hole region PA, when viewed in a plan view (e.g., a view normal to the display region DA). In some embodiments, the groove BR may enclose or surround the module hole MH and may have a circular or elliptical shape. The groove BR may be disposed between the module hole MH and the hole region PA to have a closed loop shape enclosing the module hole MH.

In some embodiments, the module hole MH may be overlapped with the hole region PA, when viewed in a plan view. The module hole MH may be disposed in the hole region PA and may be enclosed by the groove BR. In some embodiments, the module hole MH may have a circular or elliptical shape.

However, the inventive concept is not limited to this example, and in some embodiments, if in the display region DA, the hole region PA is overlapped with the module hole MH, the planar shape of the hole region PA is not limited to a specific shape and the groove BR and the module hole MH may have the various or different suitable shapes.

The display panel DP may include a base substrate BS, a circuit device layer CL, and a display element layer PL. The circuit device layer CL may be disposed on the base substrate BS, and the display element layer PL may be disposed on the circuit device layer CL.

The base substrate BS may include a glass substrate, a metal substrate, and/or a flexible plastic substrate. However, the inventive concept is not limited to this example, and in some embodiments, the base substrate BS may be a substrate including an organic material. The base substrate BS may be rigid or flexible, and the inventive concept is not limited to any specific embodiment.

The circuit device layer CL may include a transistor TR, a plurality of insulating layers BI, IL1, IL2, and IH, and a protection inorganic layer CO. The circuit device layer CL may be disposed on the base substrate BS.

A barrier layer BI may be disposed on the base substrate BS. The barrier layer BI may cover the base substrate BS. The barrier layer BI may be an insulating layer including an inorganic material. For example, the barrier layer BI may be formed of or include at least one of aluminum oxide (AlOx), titanium oxide (TiOx), silicon oxide (SiOx), silicon oxynitride (SiOxNy), zirconium oxide (ZrOx), and/or hafnium oxide (HfOx). The barrier layer BI may be formed of or include a plurality of inorganic layers. The barrier layer BI may prevent or substantially prevent an external material from passing therethrough.

In some embodiments, the display panel DP may further include a buffer layer. The buffer layer may be disposed on the barrier layer BI. The buffer layer may include an inorganic material or an organic material. The buffer layer may be higher than or better than the barrier layer BI, in terms of an adhesion strength to a semiconductor pattern SL or a first insulating layer IL1 to be described below. Thus, the circuit element layer CL may be stably formed on the base substrate BS.

The transistor TR may include the semiconductor pattern SL, a control electrode CE, an input electrode IE, and an output electrode OE. The control electrode CE of the transistor TR may control a current flow in the semiconductor pattern SL and may output an electrical signal, which is input from the input electrode IE, selectively to the output electrode OE. FIG. 5B illustrates the transistor TR, which is one of the transistors TR1 and TR2 of FIG. 3 (e.g., is used as a driving transistor).

The semiconductor pattern SL may be disposed on the base substrate BS. The semiconductor pattern SL may include at least one of crystalline semiconductor materials, metal oxide semiconductor materials, poly silicon, or amorphous silicon.

The control electrode CE of the transistor TR is illustrated to be disposed on the semiconductor pattern SL, but the inventive concept is not limited to this embodiment. In some embodiments, the control electrode CE may be disposed on the base substrate BS and may be covered with the first insulating layer IL1, and the semiconductor pattern SL may be disposed on the first insulating layer IL1. For example, the transistor TR may have a bottom-gate structure.

The first insulating layer IL1 may be disposed between the semiconductor pattern SL and the control electrode CE. The first insulating layer IL1 may cover the base substrate BS and the semiconductor pattern SL. The first insulating layer IL1 may be formed of or include an inorganic material, but the inventive concept is not limited to a specific material of the first insulating layer IL1.

The control electrode CE may be disposed on the semiconductor pattern SL. The control electrode CE may be overlapped with the semiconductor pattern SL. The control electrode CE may be spaced apart from the semiconductor pattern SL with the first insulating layer IL1 interposed therebetween.

A second insulating layer IL2 may be disposed between the control electrode CE and the input electrode IE and between the control electrode CE and the output electrode OE. The second insulating layer IL2 may cover the first insulating layer IL1 and the control electrode CE. The second insulating layer IL2 may be formed of or include an inorganic material, but the inventive concept is not limited to a specific material of the second insulating layer IL2.

The input electrode IE and the output electrode OE may be disposed on the second insulating layer IL2. The input electrode IE and the output electrode OE may penetrate the first and second insulating layers IL1 and IL2 and may be coupled to two opposite portions of the semiconductor pattern SL, respectively. In some embodiments, the input electrode IE and the output electrode OE may be coupled to two different portions of the semiconductor pattern SL with the control electrode CE between the input electrode IE and the output electrode OE. However, the inventive concept is not limited to these examples, and in some embodiments, the input electrode IE and the output electrode OE may be directly coupled to the semiconductor pattern SL.

A third insulating layer IH may be disposed on the second insulating layer IL2. The third insulating layer IH may cover the transistor TR. The third insulating layer IH may be disposed between the transistor TR and the display element layer PL to disconnect (e.g., electrically disconnect) the transistor TR from the display element layer PL.

The display element layer PL may include a pixel definition layer PLE, the organic light emitting element ED, and an encapsulation layer TFE. The pixel definition layer PLE may be disposed on the third insulating layer IH. A plurality of openings may be defined in the pixel definition layer PLE.

The organic light emitting element ED may include a first electrode E1, a second electrode E2, a light emitting pattern EL, and a charge control layer OL. The first electrode E1 may be disposed on the third insulating layer IH. The first electrode E1 may pass through the third insulating layer IH and may be connected (e.g., electrically connected) to the transistor TR. In some embodiments, a plurality of the first electrodes E1 may be provided. At least a portion of each of the first electrodes E1 may be exposed by a corresponding one of the openings in the pixel definition layer PLE.

The second electrode E2 may be disposed on the first electrode E1. The second electrode E2 may be disposed to cover at least a portion of the pixel definition layer PLE. However, the inventive concept is not limited to this example, and in some embodiments, the second electrode E2 may extend to the hole region PA and may cover the hole region PA.

For example, the second electrodes E2 of the organic light emitting elements ED may be connected to each other to form a single continuous (or monolithic) object. Thus, the organic light emitting elements ED may be applied with the same voltage through the common the second electrode E2. In this case, an additional patterning process for forming the second electrode E2 may be omitted. However, the inventive concept is not limited to this example, and in some embodiments, a plurality of the second electrodes E2 spaced apart from each other may be provided to correspond to the openings, respectively.

The second electrode E2 may include a transmissive electrode, which is optically transparent. For example, the second electrode E2 may be formed of or include at least one of indium zinc oxide (IZO), indium tin oxide (ITO), indium gallium oxide (IGO), indium zinc gallium oxide (IGZO), mixtures thereof, or compounds thereof. Thus, an image may be displayed on the front surface of the display panel DP.

However, the inventive concept is not limited to this example, and in some embodiments, the second electrode E2 may include a reflective or transflective electrode, depending on a display direction of an image.

The light emitting pattern EL may be disposed between the first electrode E1 and the second electrode E2. In some embodiments, a plurality of the light emitting patterns EL may be disposed in the openings, respectively. In the organic light emitting element ED, a potential difference between the first electrode E1 and the second electrode E2 may be adjusted to activate the light emitting pattern EL or to cause a light emitting operation of the light emitting pattern EL.

In some embodiments, the light emitting pattern EL may include a low molecular organic material or a polymer organic material. For example, in the case where the light emitting pattern EL emits a red light, the light emitting pattern EL may include tetraphenylnaphthacene (rubrene), tris(1-phenylisoquinoline) iridium(III) (Ir(piq)3), bis(2-benzo[b]thiophene-2-yl-pyridine) (acetylacetonate)iridium (III) (Ir(btp)2(acac)), tris(dibenzoyl)phenanthroline europium (III) (Eu(dbm)3(phen)), tris[4,4'-di-tert-butyl-(2,2')-bipyridine]ruthenium(III)complex (Ru(dtb-bpy)3*2(PF6)), DCM1, DCM2, Eu(thenoyltrifluoroacetone)3 (Eu(TTA)3, butyl-6-(1,1,7,7-tetramethyljulolidyl-9-enyl)-4H-pyran (DCJTB), and/or other polymeric light-emitting materials, such as polyfluorene polymers and polyvinyl polymers.

In the case where the light emitting pattern EL emits a green light, the light emitting pattern EL may include green light-emitting materials including 3-(2-benzothiazolyl)-7-(diethylamino)coumarin (Coumarin 6) 2,3,6,7-tetrahydro-1, 1,7,7-tetramethyl-1H,5H,11H-10-(2-benzothiazolyl)quinolizino-[9, 9a,1gh]coumarin (C545T), N,N'-dimethyl-quinacridone (DMQA), tris(2-phenylpyridine)iridium(III) (Ir(ppy)3), and/or other polymeric light-emitting materials, such as polyfluorene polymers and polyvinyl polymers.

In the case where the light emitting pattern EL emits a blue light, the light emitting pattern EL may include blue light-emitting materials including oxadiazole dimer dyes (Bis-DAPDXP), spiro compounds (Spiro-DPVBi, Spiro-6P), triarylamine compounds, bis(styryl)amine) (DPVBi, DSA), 4,4'-bis(9-ethyl-3-carbazovinylen)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III (FIrPic), and/or other polymeric light-emitting materials, such as polyfluorene polymers or polyvinyl polymers.

In some embodiments, the light emitting pattern EL may include a material containing a quantum dot. The core of the quantum dot may be selected from the group consisting of II-VI compounds, III-V compounds, IV-VI compounds, IV elements, IV compounds, and/or combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and/or mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, and InAlPSb), and/or mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPb-STe), and mixtures of the quaternary compounds. The IV elements may be selected from the group consisting of Si, Ge, and mixtures thereof. The IV compounds may include binary compounds selected from the group consisting of SiC, SiGe, and/or mixtures thereof.

In some embodiments, the binary, ternary, or quaternary compound may have a uniform concentration throughout the particle or may have a spatially varying concentration distribution in each particle. In some embodiments, the quantum dot may have a core-shell structure, in which a quantum dot is surrounded by another quantum dot. At an interface between the core and the shell, an element contained in the shell may have a concentration gradient decreasing in a central direction (e.g., a direction toward the core).

In some embodiments, each of the quantum dots may have a core-shell structure, which includes a core containing the afore-described nanocrystal and a shell surrounding the core. The shell of the quantum dot may be used as a protection layer, which prevents or substantially prevents chemical characteristics of the core from being changed and preserves the semiconductor property of the core, and/or may be used as a charging layer, which allows the quantum dot to have an electrophoresis property. The shell may be a single layer shell or a multi-layer shell. At an interface between the core and the shell, an element contained in the shell may have a concentration gradient decreasing in a central direction. In some embodiments, the shell of the quantum dot may be formed of or include oxide compounds of metallic or nonmetallic elements, semiconductor compounds, or any combination thereof.

For example, the oxide compounds of metallic or nonmetallic elements for the shell may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$) and/or ternary compounds (e.g., $MgAl_2O_4$, $CoFe_2O_4$, $NiFe_2O_4$, and $CoMn_2O_4$), but the inventive concept is not limited to these examples.

In addition, the semiconductor compounds for the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and/or AlSb, but the inventive concept is not limited to these examples.

Each of the quantum dots may have a light-emitting wavelength spectrum whose full width half maximum (FWHM) is less than about 45 nm (in particular, less than about 40 nm or in more particular, less than about 30 nm). Thus, it may be possible to realize improved color purity or color reproduction characteristics. Furthermore, the quantum dots may allow light to be emitted radially, and thus, it may be possible to improve a viewing angle.

In some embodiments, the quantum dots may be a spherical, pyramid-shaped, multi-arm, or cubic nano particle. In another embodiment, the quantum dots may be a nano tube, a nano wire, a nano fiber, a nano plate-shaped particle, but the inventive concept is not limited to these examples.

A wavelength or color of light emitted from the quantum dot may be determined by a particle size of the quantum dot, and because quantum dots of various sizes are provided, it may be possible to realize various colors (e.g., blue, red, and green).

The charge control layer OL may be disposed between the first electrode E1 and the second electrode E2. The charge control layer OL may be disposed adjacent to the light emitting pattern EL. In the present embodiment, the charge control layer OL is illustrated to be disposed between the light emitting pattern EL and the second electrode E2. However, the inventive concept is not limited to this example, and the charge control layer OL may be disposed between the light emitting pattern EL and the first electrode E1 or may be provided as a plurality of layers, which are stacked in the third direction DR3 (e.g., the thickness direction) with the light emitting pattern EL interposed therebetween.

The charge control layer OL may be formed without any additional patterning process, and thus, the charge control layer OL may have a shape overlapped with the entire top surface of the base substrate BS. The charge control layer OL may also be disposed in a region, which is different from the openings formed in the pixel definition layer PLE. For example, the charge control layer OL may be disposed to be overlapped with the display region DA and the hole region PA.

The charge control layer OL may be used to control motion of electrons and thereby to improve light-emitting efficiency of the display panel DP. The charge control layer OL may include an electron transport layer and an electron injection layer.

In some embodiments, the charge control layer OL may include an organic pattern OL-T, a first pattern OL-O, and a second pattern OL-P. The organic pattern OL-T, the first pattern OL-O, and the second pattern OL-P may be formed by substantially the same process, thereby containing the same material, but for convenience in description, they may be described as separate elements.

The organic pattern OL-T may be disposed in the display region DA. The organic pattern OL-T may be defined as a portion of the charge control layer OL overlapped with the light emitting pattern EL. The organic pattern OL-T may cover the pixel definition layer PLE, which is adjacent to the light emitting pattern EL, and the light emitting pattern EL. At least a portion of the organic pattern OL-T may be covered with the second electrode E2.

The first pattern OL-O may be disposed in a portion of the hole region PA. For example, the first pattern OL-O may cover portions of the pixel definition layer PLE, the third insulating layer IH, and the second insulating layer IL2, which are spaced apart from the light emitting pattern EL. The first pattern OL-O may be covered with the protection inorganic layer CO.

The second pattern OL-P may be provided in a recessed region BH of the hole region PA. The second pattern OL-P may be spaced apart from the first pattern OL-O and may be disposed in the recessed region BH. In some embodiments, the second pattern OL-P may be formed to cover only a portion of the recessed region BH. In some embodiments, the second pattern OL-P may be disposed at a center of the recessed region BH. The protection inorganic layer CO may be disposed on the second pattern OL-P. Thus, the second pattern OL-P may be fully covered with the protection inorganic layer CO. For example, an upper surface and opposing side surfaces of the second pattern OL-P may be covered with the protection inorganic layer CO.

The first pattern OL-O and the second pattern OL-P may be spaced apart from each other by an under-cut structure, which is formed due to a difference in etch rate between the insulating layers BI, IL1, and IL2 and the base substrate BS, during a process of forming the charge control layer OL. For example, in a process of providing an organic material to form the charge control layer OL, the organic material may not be formed on a portion of a side surface of the recessed region BH of the base substrate BS, due to the under-cut structure. Thus, the first pattern OL-O and the second pattern OL-P may be disconnected (e.g., physically disconnected) from each other.

Because the second pattern OL-P is disconnected from other portions of the charge control layer OL, the second pattern OL-P may block a diffusion path of moisture and oxygen, which is supplied from the module hole MH. Thus, it may be possible to improve reliability of the display panel DP.

The encapsulation layer TFE may be disposed on the organic light emitting element ED. The encapsulation layer TFE may include a first inorganic encapsulation layer LIL, an organic encapsulation layer OEL, and/or a second inorganic encapsulation layer UIL.

The first inorganic encapsulation layer LIL may be disposed on the display element layer PL. The first inorganic encapsulation layer LIL may be disposed on the charge control layer OL, which is disposed on the base substrate BS, to be in contact with the charge control layer OL. The second inorganic encapsulation layer UIL may be disposed on the first inorganic encapsulation layer LIL. The first inorganic encapsulation layer LIL and the second inorganic encapsulation layer UIL may seal or encapsulate the organic encapsulation layer OEL.

In some embodiments, the first inorganic encapsulation layer LIL and the second inorganic encapsulation layer UIL may include different inorganic materials from each other. In a region overlapped with the display region DA, the first inorganic encapsulation layer LIL may be disposed adjacent to the organic light emitting element ED, compared with the second inorganic encapsulation layer UIL, and thus, the first inorganic encapsulation layer LIL may include a material to compensate light generated in the organic light emitting element ED. For example, the first inorganic encapsulation layer LIL may include silicon oxynitride (SiOxNy) or low-refractive silicon oxynitride (SiOxNy).

The second inorganic encapsulation layer UIL may be disposed adjacent to or closer to the outside, compared with the first inorganic encapsulation layer LIL. In some embodiments, the second inorganic encapsulation layer UIL is an outermost layer. Thus, the second inorganic encapsulation layer UIL may include a material capable of easily blocking oxygen and moisture supplied from the outside. For example, the second inorganic encapsulation layer UIL may include at least one of aluminum oxide (AlOx), silicon nitride (SiNx), silicon oxynitride (SiOxNy), silicon carbide (SiCx), titanium oxide (TiOx), zirconium oxide (ZrOx), or zinc oxide (ZnOx).

In some embodiments, the second inorganic encapsulation layer UIL may include a material with a good or better encapsulation property, compared with the first inorganic encapsulation layer LIL, and thus, an oxidation rate may be slower in the second inorganic encapsulation layer UIL than in the first inorganic encapsulation layer LIL. According to some embodiments of the inventive concept, the first inorganic encapsulation layer LIL adjacent to the organic light emitting element ED may include an inorganic material, which is effective in improving optical characteristics, whereas the second inorganic encapsulation layer UIL adjacent to the outside may include an inorganic material, which has a relatively low oxidation rate and a good encapsulation property. This may make it possible to improve reliability of a display panel.

The organic encapsulation layer OEL may be disposed between the first inorganic encapsulation layer LIL and the second inorganic encapsulation layer UIL. The organic encapsulation layer OEL may be formed of or include an organic material. For example, the organic encapsulation layer OEL may be formed of or include at least one of epoxy, polyimide, polyethylene terephthalate, polycarbonate, polyethylene, or polyacrylate.

When viewed in a plan view, each of the first inorganic encapsulation layer LIL and the second inorganic encapsulation layer UIL may be a single structure that is disposed on the entire top surface of the display panel DP. Each of the first inorganic encapsulation layer LIL and the second inorganic encapsulation layer UIL may be partially overlapped with the organic encapsulation layer OEL. Thus, in some regions, the first inorganic encapsulation layer LIL and the second inorganic encapsulation layer UIL may be spaced apart from each other in the third direction DR3 with the organic encapsulation layer OEL interposed therebetween, whereas in other regions, the first inorganic encapsulation layer LIL and the second inorganic encapsulation layer UIL may be in direct contact with each other in the third direction DR3. The encapsulation layer TFE may hermetically seal the organic light emitting element ED and may protect the organic light emitting element ED from an external contamination material.

The module hole MH may be overlapped with the hole region PA. The module hole MH may be disposed in the hole region PA. The module hole MH may be formed to penetrate some of elements constituting the display panel DP. For example, the module hole MH may be formed to penetrate the base substrate BS, the barrier layer BI, the first insulating layer IL1, the second insulating layer IL2, the protection inorganic layer CO, the charge control layer OL, the first inorganic encapsulation layer LIL, and the second inorganic encapsulation layer UIL. In the case where the second electrode E2 is extended to the hole region PA, the module hole MH may be formed to penetrate the second electrode E2.

The module hole MH may be defined by end portions of the penetrated elements of the display panel DP. An end portion BS-E of the base substrate, an end portion BI-E of the barrier layer, an end portion IL1-E of the first insulating layer, an end portion IL2-E of the second insulating layer, an end portion CO-E of the protection inorganic layer, an end portion OL-E of the charge control layer, an end portion LIL-E of the first inorganic encapsulation layer, and an end portion UIL-ES of the second inorganic encapsulation layer, which are penetrated by the module hole MH and are exposed, may define an inner surface GE of the module hole MH.

The end portion BS-E of the base substrate, the end portion BI-E of the barrier layer, the end portion IL1-E of the first insulating layer, the end portion IL2-E of the second insulating layer, the end portion CO-E of the protection inorganic layer, the end portion OL-E of the charge control layer, the end portion LIL-E of the first inorganic encapsulation layer, and the end portion UIL-ES of the second inorganic encapsulation layer, which constitute the inner surface GE, may be aligned with each other.

The groove BR may be overlapped with the hole region PA. The groove BR may be recessed from a portion of the base substrate BS, and may be covered with at least one of the protection inorganic layer CO, the first inorganic encapsulation layer LIL, and the second inorganic encapsulation layer UIL. According to some embodiments of the inventive concept, because the groove BR is disposed near, adjacent to, or around the module hole MH, it may be possible to block moisture and oxygen, which are supplied through (or from) the module hole MH. Thus, it may be possible to improved reliability of the display panel DP.

Referring to FIG. 5C, the base substrate BS may include the recessed region BH, which is overlapped with the hole region PA and is formed by recessing at least a portion of the base substrate BS. The barrier layer BI may include a first opening BG1, which is overlapped with the hole region PA and is formed to penetrate the barrier layer BI, the first insulating layer IL1 may include a second opening BG2, which is overlapped with the hole region PA and is formed to penetrate the first insulating layer IL1, and the second insulating layer IL2 may include a third opening BG3, which is overlapped with the hole region PA and is formed to penetrate the second insulating layer IL2. The recessed region BH, the first opening BG1, the second opening BG2, and the third opening BG3 may be overlapped with each other, when viewed in a plan view.

The groove BR may be defined by at least one of the protection inorganic layer CO, the first inorganic encapsulation layer LIL, and the second inorganic encapsulation layer UIL, which is formed to cover an inner surface of each of the recessed region BH, the second pattern OL-P, the first opening BG1, the second opening BG2, and the third opening BG3.

In some embodiments, the groove BR may include an internal space BR-I. The internal space BR-I may be a region, which is defined by the protection inorganic layer CO, the first inorganic encapsulation layer LIL, and the second inorganic encapsulation layer UIL covering the inner surface of each of the recessed region BH, the first opening BG1, the second opening BG2, and the third opening BG3.

In some embodiments, the internal space BR-I of the groove BR may be provided by covering the under-cut structure of the inner surfaces, which are exposed by etching the base substrate BS and the insulating layers BI, IL1, and IL2, with at least one of the protection inorganic layer CO, the first inorganic encapsulation layer LIL, or the second inorganic encapsulation layer UIL. In some embodiments, the internal space BR-I of the groove BR may be overlapped with the barrier layer BI, the first insulating layer IL1, and/or the second insulating layer IL2. In other words, the internal space BR-I may define an opening larger than the first opening BG1, the second opening BG2, and/or the third opening BG3 when viewed from a plan view.

In some embodiments, the protection inorganic layer CO may be disposed in the hole region PA. The protection inorganic layer CO may be spaced apart from the organic light emitting element ED, when viewed in a plan view. For example, the protection inorganic layer CO may not be overlapped with the display region DA.

A portion of the protection inorganic layer CO may be overlapped with the groove BR and may be one of the end portions defining the inner surface GE of the module hole MH. In FIG. 5A, a shade region depicts a region, in which the protection inorganic layer CO according to some embodiments of the inventive concept is disposed.

The protection inorganic layer CO may be disposed between the insulating layers IL2, IH, and PLE and the first inorganic encapsulation layer LIL. In some embodiments, the protection inorganic layer CO may be in contact with the first pattern OL-O partly covering the insulating layers IL2, IH, and PLE, the second pattern OL-P disposed in the recessed region BH, a portion of the recessed region BH exposed by the second pattern OL-P, the inner surface of each of the first opening BG1, the second opening BG2, and the third opening BG3, and a rear surface of the barrier layer BI overlapped with the recessed region BH.

The protection inorganic layer CO may be covered with the first inorganic encapsulation layer LIL, and the protection inorganic layer CO may be in contact with the first inorganic encapsulation layer LIL. The second inorganic encapsulation layer UIL may be disposed on the first inorganic encapsulation layer LIL.

In some embodiments, the protection inorganic layer CO may be formed of or include the same material as the second inorganic encapsulation layer UIL of the encapsulation layer TFE. For example, the protection inorganic layer CO may include at least one of aluminum oxide (AlOx), silicon nitride (SiNx), silicon oxynitride (SiOxNy), silicon carbide (SiCx), titanium oxide (TiOx), zirconium oxide (ZrOx), or zinc oxide (ZnOx).

According to some embodiments of the inventive concept, because the protection inorganic layer CO includes an inorganic material with a good encapsulation property, it may be possible to block moisture and oxygen, which may be provided from the base substrate BS. Thus, it may be possible to improve reliability of the display panel.

According to some embodiments of the inventive concept, the barrier layer BI, the first insulating layer IL1, and the second insulating layer IL2, which are overlapped with the groove BR (e.g., the internal space BR-I) and are protruded from the recessed region BH when viewed in a plan view, may be defined as a tip portion TP. In some embodiments, the tip portion TP may include a portion of each of the barrier layer BI, the first insulating layer IL1, and the second insulating layer IL2. However, the inventive concept is not limited to this example, and in some embodiments, at least one of the barrier layer BI, the first insulating layer IL1, and the second insulating layer IL2 may not constitute the tip portion TP.

In the case where the tip portion TP, a part of the under-cut structure, is formed of a plurality of insulating layers, a delamination issue may occur between the insulating layers constituting the tip portion TP, and a cracking issue may be caused by an external impact. In the case where the delamination and/or cracking issues occur in the insulating layers of the tip portion TP, external moisture and oxygen may infiltrate into the circuit device layer CL and the display element layer PL, thereby causing deterioration in reliability of the display panel DP.

According to some embodiments of the inventive concept, because the protection inorganic layer CO is additionally provided to cover the tip portion TP, the tip portion TP may be designed to have a robust structure. Thus, it may be possible to improve impact-resistance of the display panel DP.

Figure 6:
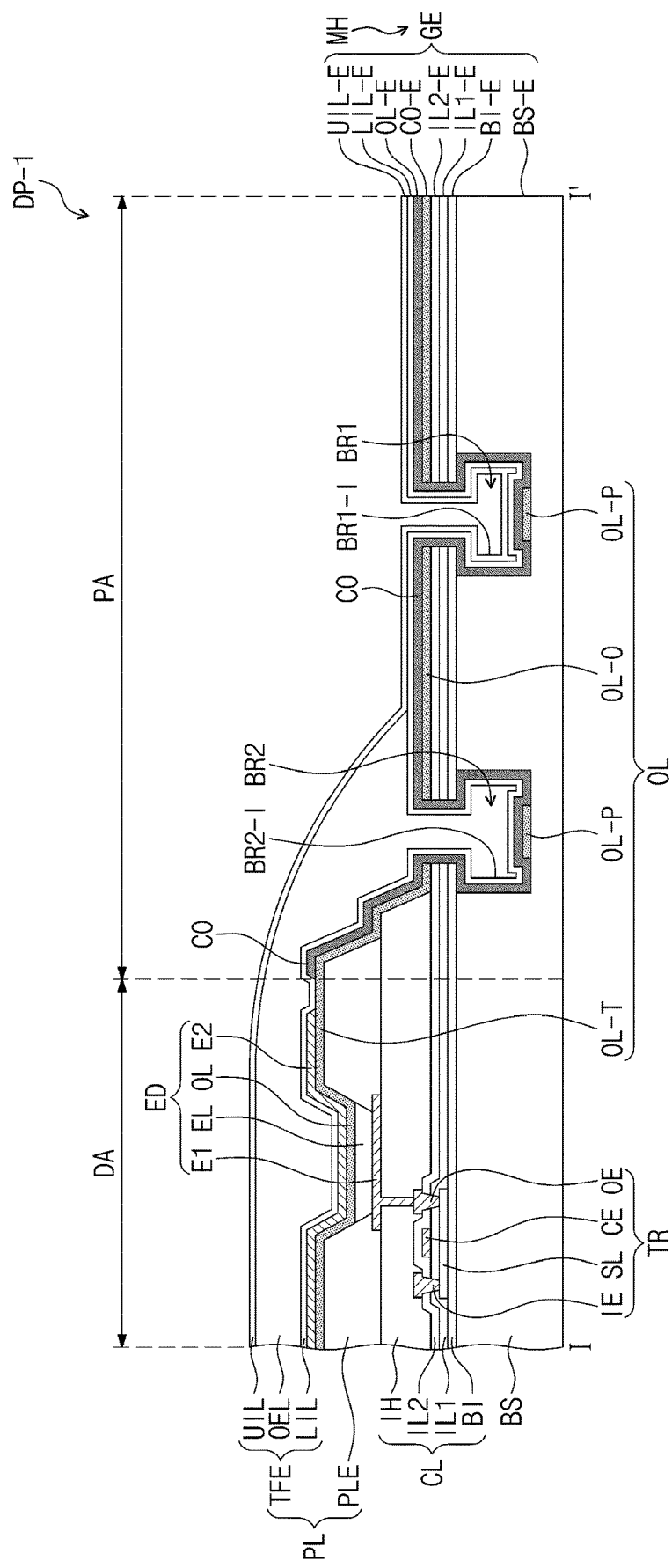
FIG. 6 is a sectional view of a portion of a display panel according to some embodiments of the inventive concept.

FIG. 6 is a sectional view of a portion of a display panel according to some embodiments of the inventive concept. For concise description, an element previously described with reference to FIGS. 1-5C may be identified by the same reference number without repeating the same or substantially the same description thereof.

Referring to FIG. 6, a display panel DP-1 according to some embodiments of the inventive concept may include a plurality of grooves BR1 and BR2. In FIG. 6, two grooves BR1 and BR2 are illustrated as examples of the plurality of grooves.

In some embodiments, the display panel DP-1 may include a first groove BR1 and a second groove BR2. The first groove BR1 and an internal space BR1-I may have substantially the same features as the groove BR and the internal space BR-I described with reference to FIGS. 5A-5C. Hereinafter, the second groove BR2 may be described in more detail below.

The second groove BR2 may be spaced apart from the module hole MH with the first groove BR1 interposed therebetween. For example, the first groove BR1 may be between the second groove BR2 and the module hole MH in the first direction DR1 and/or the second direction DR2. In some embodiments, the second groove BR2 may be spaced apart from the first groove BR1. The second groove BR2 may be formed by recessing a portion of the base substrate BS from a top surface of at least one of the insulating layers BI, IL1, and IL2. The second groove BR2 may be formed by the same process as that for the first groove BR1. However, unlike the first groove BR1, the second groove BR2 may be formed by covering an inner surface of the recessed portion of the base substrate BS and an inner surface of each of the openings of the insulating layers BI, IL1, and IL2, which is overlapped with the recessed portion, with the protection inorganic layer CO and the first inorganic encapsulation layer LIL.

The second groove BR2 may include an internal space BR2-I. The internal space BR2-I may be a region, which is defined by covering the inner surface of the recessed portion of the base substrate BS and the inner surface of each of the openings of the insulating layers BI, IL1, and IL2, which is overlapped with the recessed portion, with the protection inorganic layer CO and the first inorganic encapsulation layer LIL. The internal space BR2-I may have an under-cut structure.

In some embodiments, the internal space BR2-I of the second groove BR2 may be filled with an organic material. For example, the internal space BR2-I may be filled with the organic encapsulation layer OEL of the encapsulation layer TFE. In some embodiments, because the internal space BR2-I of the second groove BR2 is filled with the organic encapsulation layer OEL, the tip portion TP may be designed to have a robust structure. This may make it possible to improve reliability of the display panel DP-1.

In some embodiments, a plurality of grooves may be provided. For example, although two grooves BR1 and BR2 are illustrated in FIG. 6, three or more grooves may be formed, if desired, and the inventive concept is not limited to a specific number of the grooves.

Figure 7:
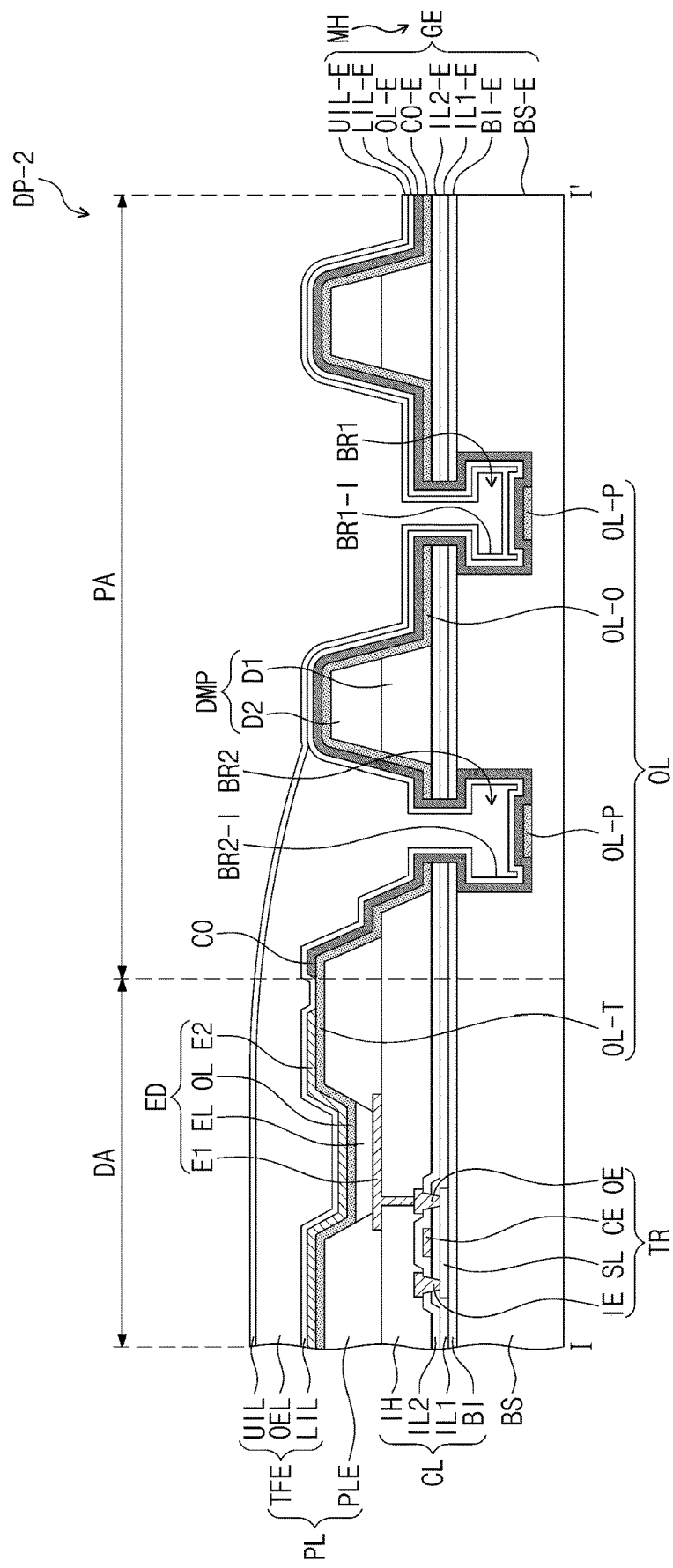
FIG. 7 is a sectional view of a portion of a display panel according to some embodiments of the inventive concept.

FIG. 7 is a sectional view of a portion of a display panel according to some embodiments of the inventive concept. For concise description, an element previously described with reference to FIGS. 1-6 may be identified by the same reference number without repeating the same or substantially the same description thereof.

Referring to FIG. 7, a display panel DP-2 according to some embodiments of the inventive concept may further include a dam portion DMP. The dam portion DMP may be overlapped with the hole region PA. The dam portion DMP may be disposed near a border between the display region DA and the hole region PA and may be extended along an edge adjacent to the hole region PA. The dam portion DMP may be enclosed by the display region DA or may be disposed near at least one of the sides of the display region DA (e.g., at a side region near a pad or a driving circuit). The dam portion DMP may be covered with the charge control layer OL.

The dam portion DMP may include a first dam portion D1 and a second dam portion D2. The dam portion DMP may be disposed on the second insulating layer IL2. In some embodiments, the first dam portion D1 may include the same material as the third insulating layer IH. The second dam portion D2 may include the same material as the pixel definition layer PLE. In some embodiments, the dam portion DMP may be formed of a plurality of layers, but the inventive concept is not limited to this embodiment. For example, the dam portion DMP may have a single-layer structure, which includes the same material as at least one of the third insulating layer IH and the pixel definition layer PLE.

In some embodiments, a liquid organic material may be supplied to form the organic encapsulation layer OEL, and in this case, the dam portion DMP may be used to delimit a spreading boundary of the liquid organic material, during the formation of the organic encapsulation layer OEL. The organic encapsulation layer OEL may be formed by an inkjet method of coating the first inorganic encapsulation layer LIL with a liquid organic material, and in this case, the dam portion DMP may delimit a boundary of a region, on which the liquid organic material is coated, and may prevent or substantially prevent the liquid organic material from being overflown to the outside of the dam portion DMP.

In some embodiments, the dam portion DMP may be disposed in at least one of regions between the first groove BR1 and the module hole MH and between the first groove BR1 and the second groove BR2. FIG. 7 illustrates an example, in which the dam portion DMP is disposed in each of the regions between the first groove BR1 and the module hole MH and between the first groove BR1 and the second groove BR2, however, the inventive concept is not limited to this example. For example, the dam portion DMP may be omitted from one of the regions between the first groove BR1 and the module hole MH and between the first groove BR1 and the second groove BR2.

FIGS. 8A-8D are enlarged sectional views, each of which illustrates a portion of a display panel according to some embodiments of the inventive concept. FIGS. 8A-8D illustrate regions corresponding to a portion TT' of FIG. 5B. For concise description, an element previously described with reference to FIGS. 1-5C may be identified by the same reference number without repeating the same or substantially the same description thereof.

Figure 8A:
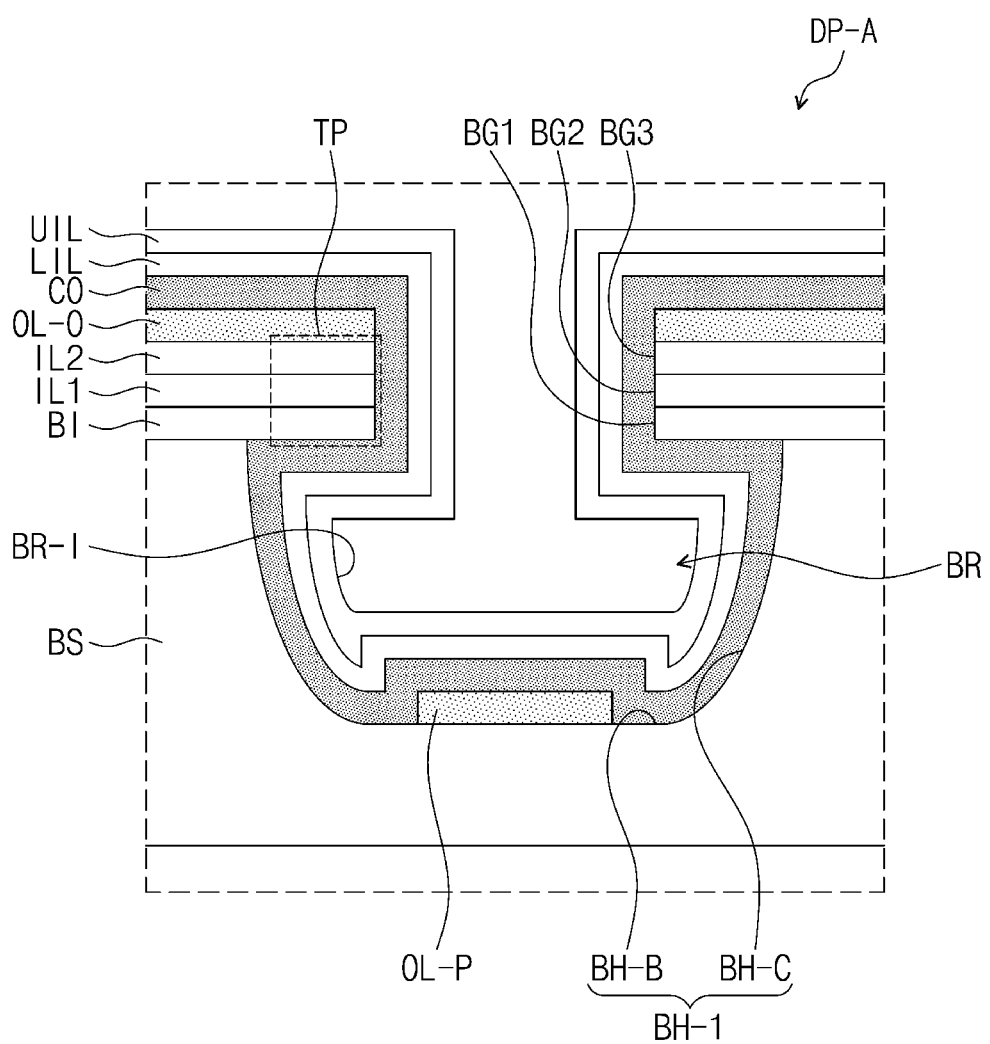
FIGS. 8A-8D are enlarged sectional views, each of which illustrates a portion of a display panel according to some embodiments of the inventive concept.

Referring to FIG. 8A, a display panel DP-A according to some embodiments of the inventive concept may include a recessed region BH-1, which is overlapped with the hole region PA (e.g., see FIG. 5B) and is formed by recessing at least a portion of the base substrate BS. In some embodiments, the recessed region BH-1 may include a bottom region BH-B and a side region BH-C.

The bottom region BH-B and the side region BH-C may be connected to each other to define an internal space of the recessed region BH-1. In some embodiments, the side region BH-C may include a curved surface. This may be due to an under-cut structure, which is formed by a difference in absorption amount of an etching material, when the etching material to remove the insulating layers BI, IL1, and IL2 is supplied in the thickness direction of the base substrate BS-1.

In some embodiments, the openings BG1, BG2, and BG3 of the insulating layers BI, IL1, and IL2, which are overlapped with the recessed region BH-1, and the first pattern OL-O may be in contact with the protection inorganic layer CO. In some embodiments, the protection inorganic layer CO may be in contact with a top surface of the first pattern OL-O and aligned side surfaces of the openings BG1, BG2, and BG3.

Figure 8B:
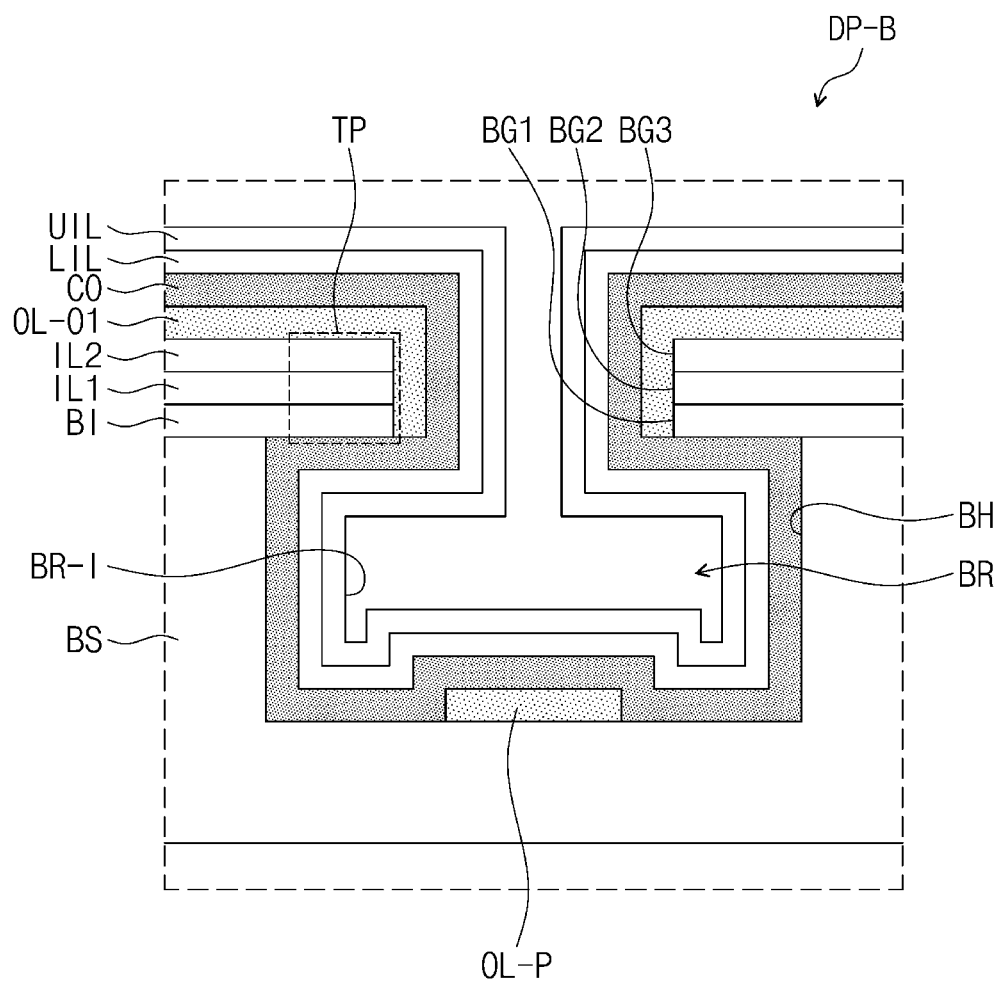

Referring to FIG. 8B, the tip portion TP of a display panel DP-B according to some embodiments of the inventive concept may be overlapped with a first pattern OL-O1. For example, the first pattern OL-O1 may be formed to cover the side surface of each of the insulating layers BI, IL1, and IL2 defining the openings BG1, BG2, and BG3. However, the inventive concept is not limited to this example, and in some embodiments, the charge control layer OL may be extended to cover at least a portion of the protection inorganic layer CO, which covers the rear surface of the barrier layer BI constituting the tip portion TP.

According to some embodiments of the inventive concept, the first pattern OL-O1 covering the tip portion TP may be spaced apart from the second pattern OL-P. Thus, the second pattern OL-P may be disconnected from the first pattern OL-O1. Because the second pattern OL-P and the first pattern OL-O1 are disconnected from each other, it may be possible to block moisture and oxygen, which is supplied from the module hole MH.

Figure 8C:
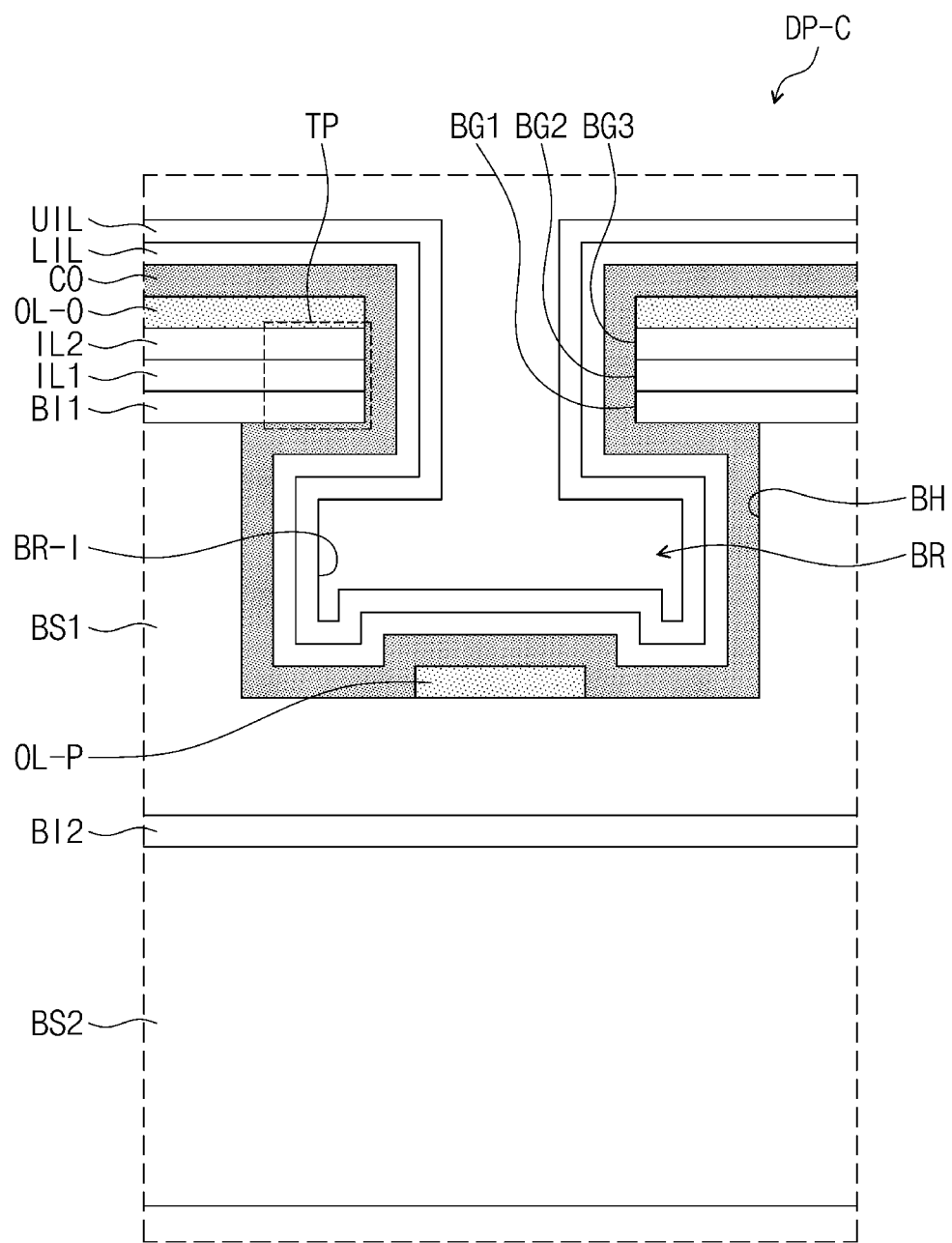

Referring to FIG. 8C, a display panel DP-C according to some embodiments of the inventive concept may further include a first base substrate BS1, a first barrier layer BI1, a second base substrate BS2, and a second barrier layer BI2.

A rear surface of the second base substrate BS2 may be defined as a rear surface of the display panel DP-C. The second barrier layer BI2 may be disposed on the second base substrate BS2. The first base substrate BS1 may be disposed on the second barrier layer BI2. The first barrier layer BI1 may be disposed on the first base substrate BS1.

The base substrates BS1 and BS2 may include an organic material. For example, the base substrates BS1 and BS2 may be formed of or include at least one of polyimide, polyethylene naphthalate, polyethylene terephthalate, polyarylate, polycarbonate, polyetherimide, or polyethersulfone.

The barrier layers BI1 and BI2 may be an insulating layer including an inorganic material. For example, the barrier layer BI may include at least one of aluminum oxide (AlOx), titanium oxide (TiOx), silicon oxide (SiOx), silicon oxynitride (SiOxNy), zirconium oxide (ZrOx), or hafnium oxide (HfOx). The barrier layers BI1 and BI2 may prevent or substantially prevent an external contamination material from pass therethrough.

In some embodiments, the groove BR may be a portion of the first base substrate BS1, which is recessed from a top surface of the first barrier layer BI1, and may be covered with at least one of the protection inorganic layer CO, the first inorganic encapsulation layer LIL and the second inorganic encapsulation layer UIL.

Figure 8D:
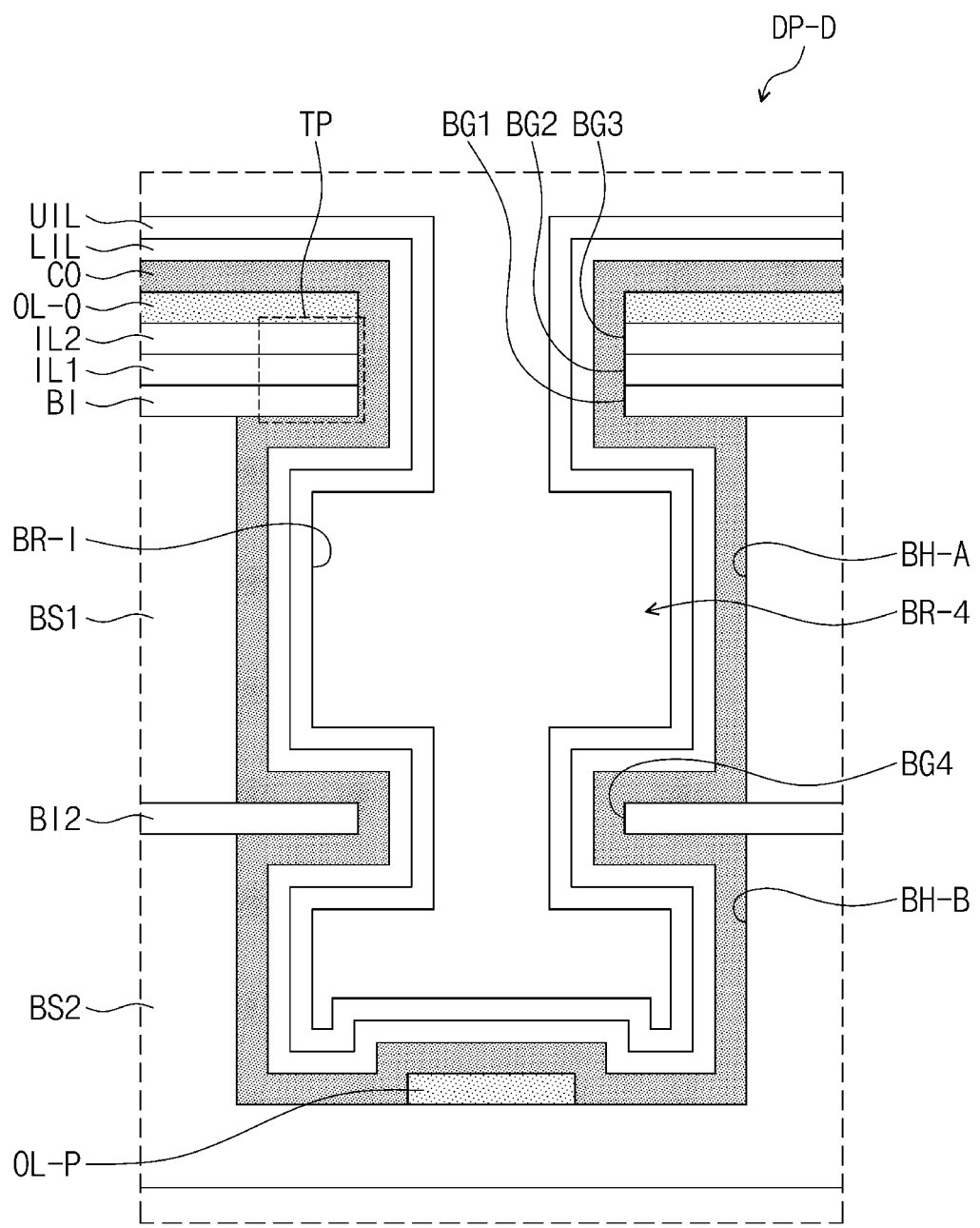

Referring to FIG. 8D, a display panel DP-D according to some embodiments of the inventive concept may further include the first base substrate BS1, the first barrier layer BI1, the second base substrate BS2, and the second barrier layer BI2. In some embodiments, the first base substrate BS1, the first barrier layer BI1, the second base substrate BS2, and the second barrier layer BI2 may be substantially the same as the base substrates BS1 and BS2 and the barrier layers BI1 and BI2 of FIG. 8C.

In some embodiments, the first barrier layer BI1 may include the first opening BG1, which is formed to penetrate the first barrier layer BI1. The first insulating layer IL1 may include the second opening BG2, which is formed to penetrate the first insulating layer IL1, and the second insulating layer IL2 may include the third opening BG3, which is formed to penetrate the second insulating layer IL2. The first base substrate BS1 may include a penetration hole BH-A, which is formed to penetrate the first base substrate BS1.

The second barrier layer BI2 may include a fourth opening BG4, which is formed to penetrate the second barrier layer BI2, and the second base substrate BS2 may include a recessed region BH-B, which is formed by recessing at least a portion of the second base substrate BS2.

In some embodiments, each of the first opening BG1, the second opening BG2, the third opening BG3, the penetration hole BH-A, the fourth opening BG4, and the recessed region BH-B may be overlapped with each other, on the hole region PA.

In some embodiments, a groove BR-4 may be defined by at least one of the protection inorganic layer CO, the first inorganic encapsulation layer LIL, and the second inorganic encapsulation layer UIL, which is formed to cover an inner surface of each of the first opening BG1, the second opening BG2, the third opening BG3, the penetration hole BH-A, the fourth opening BG4, and the recessed region BH-B.

Because a plurality of base substrates and barrier layers are penetrated or recessed to form the groove BR-4, it may be possible to increase a length of a penetration path of moisture and oxygen, which is entered through the module hole MH (e.g., see FIG. 5B), and thereby to improve reliability of the display panel DP.

According to some embodiments of the inventive concept, the display panel DP may include the protection inorganic layer CO, which is formed to cover inner surfaces of the recessed base substrate and the penetrated insulating layers, and thus, the tip portion TP may be designed to have a robust structure. This may make it possible to improve impact-resistance of a display panel.

Figure 9A:
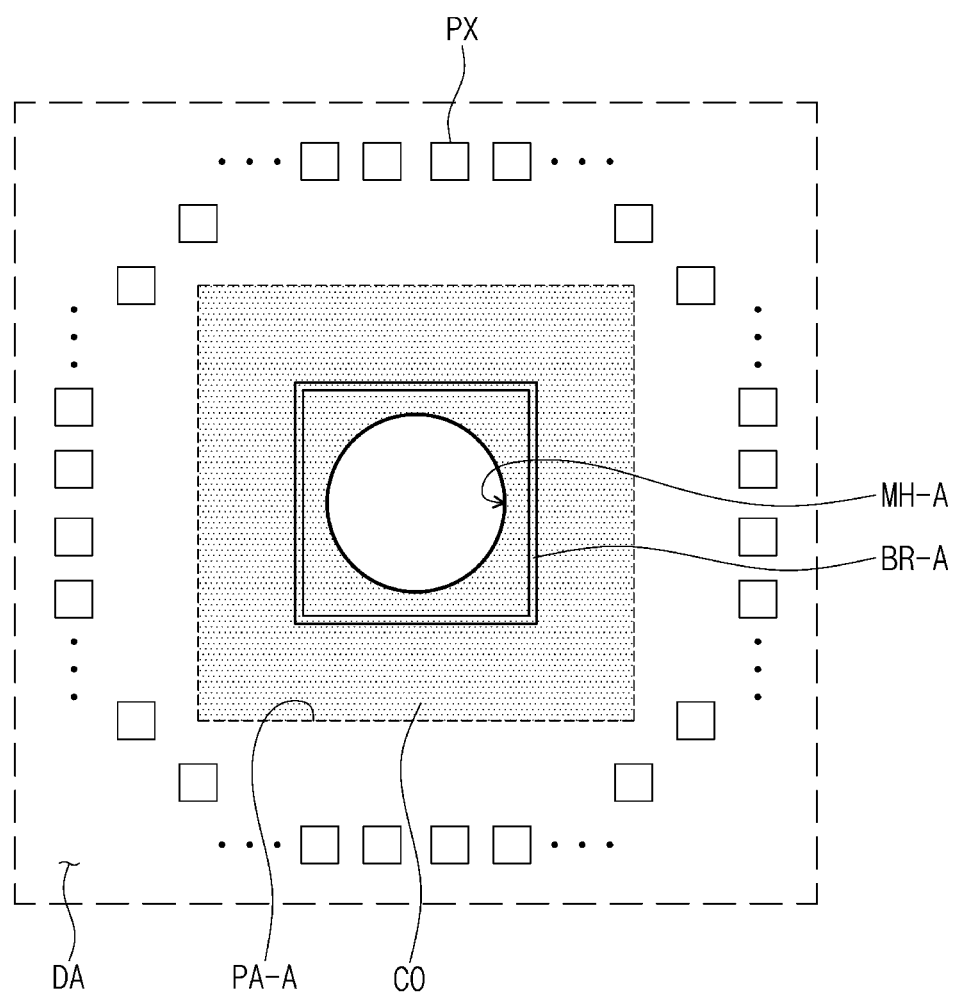
FIGS. 9A and 9B are enlarged plan views, each of which illustrates a portion of a display panel according to some embodiments of the inventive concept.
Figure 9B:
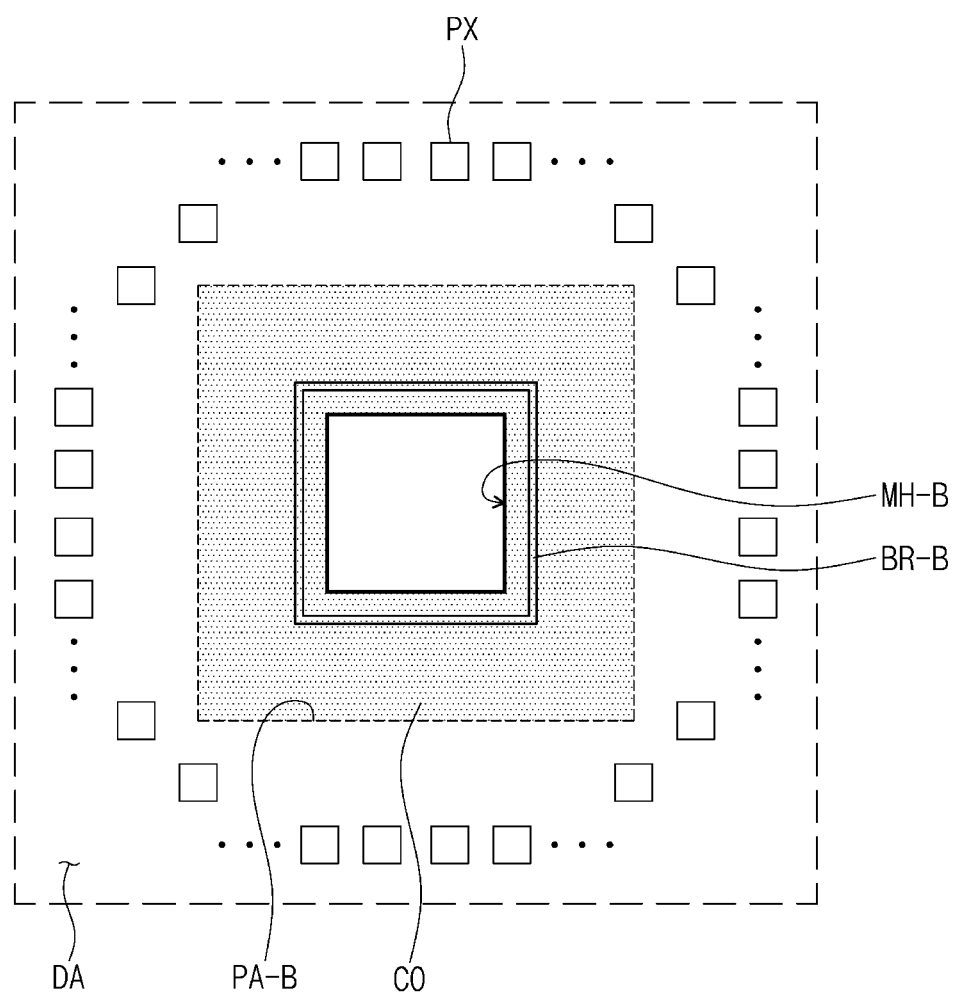

FIGS. 9A and 9B are enlarged plan views, each of which illustrates a portion of a display panel according to some embodiments of the inventive concept. For concise description, an element previously described with reference to FIGS. 1-5C may be identified by the same reference number without repeating the same or substantially the same description thereof.

Referring to FIG. 9A, a module hole MH-A and a groove BR-A, according to some embodiments of the inventive concept, may have planar shapes different from each other. For example, a module hole MH-A may have a circular shape. The groove BR-A may have a closed-line shape enclosing the module hole MH-A. In some embodiments, the closed-line shape of the groove BR-A may have a rectangular or tetragonal shape. A planar shape of a hole region PA-A enclosing the groove BR-A may be the same as the closed-line shape of the groove BR-A.

Because the module hole MH-A and the groove BR-A have planar shapes different from each other, a length of a penetration path of moisture and oxygen entered through the module hole MH-A may be increased, and this may make it possible to improve reliability of the display panel DP (e.g., see FIG. 5B).

Referring to FIG. 9B, a module hole MH-B and a groove BR-B according to some embodiments of the inventive concept may have substantially the same planar shape. For example, the shape of a module hole MH-B may be rectangular or tetragonal. The groove BR-B may have a closed-line shape enclosing the module hole MH-B. In some embodiments, the closed-line shape of the groove BR-B may be rectangular or tetragonal. A planar shape of a hole region PA-B enclosing the groove BR-B may be the same as the closed-line shape of the groove BR-B.

However, the inventive concept is not limited to this example, and in some embodiments, the hole region PA-A or PA-B, the module hole MH-A or MH-B, and the groove BR-A or BR-B may have different shapes from each other, when viewed in a plan view. The inventive concept is not limited to any specific embodiment.

In the case where the planar shapes of the module hole MH-B and the groove BR-B are similar to each other, an area of a space between the module hole MH-B and the groove BR-B may be decreased. Thus, an occupying area of the hole region PA-B in the display region DA (e.g., see FIG. 2) may be reduced and thus it may be possible to reduce the influence of the hole peripheral region PA-B on the display region DA.

In FIGS. 8A and 8B, a shade region depicts a region, in which the protection inorganic layer CO according to some embodiments of the inventive concept is disposed. In FIGS. 8A and 8B, the protection inorganic layer CO is illustrated to have the end portion that is positioned on or near a boundary between the display region DA and the hole region PA, but the inventive concept is not limited to this example. For example, the position of the end portion of the protection inorganic layer CO may be suitably changed in a various manner, as long as the protection inorganic layer CO is overlapped with the groove BR-A or BR-B in the hole region PA.

According to some embodiments of the inventive concept, the protection inorganic layer CO may be disposed to be overlapped with only the hole region PA, and thus, the protection inorganic layer CO may be spaced apart from the organic light emitting element ED.

FIGS. 10A-10F are sectional views illustrating a method of fabricating a display panel, according to some embodiments of the inventive concept. For concise description, an element previously described with reference to FIGS. 1-5C may be identified by the same reference number without repeating the same or substantially the same description thereof. Hereinafter, a method of fabricating a display panel, according to some embodiments of the inventive concept, may be described in more detail with reference to FIGS. 10A-10F.

Figure 10A:
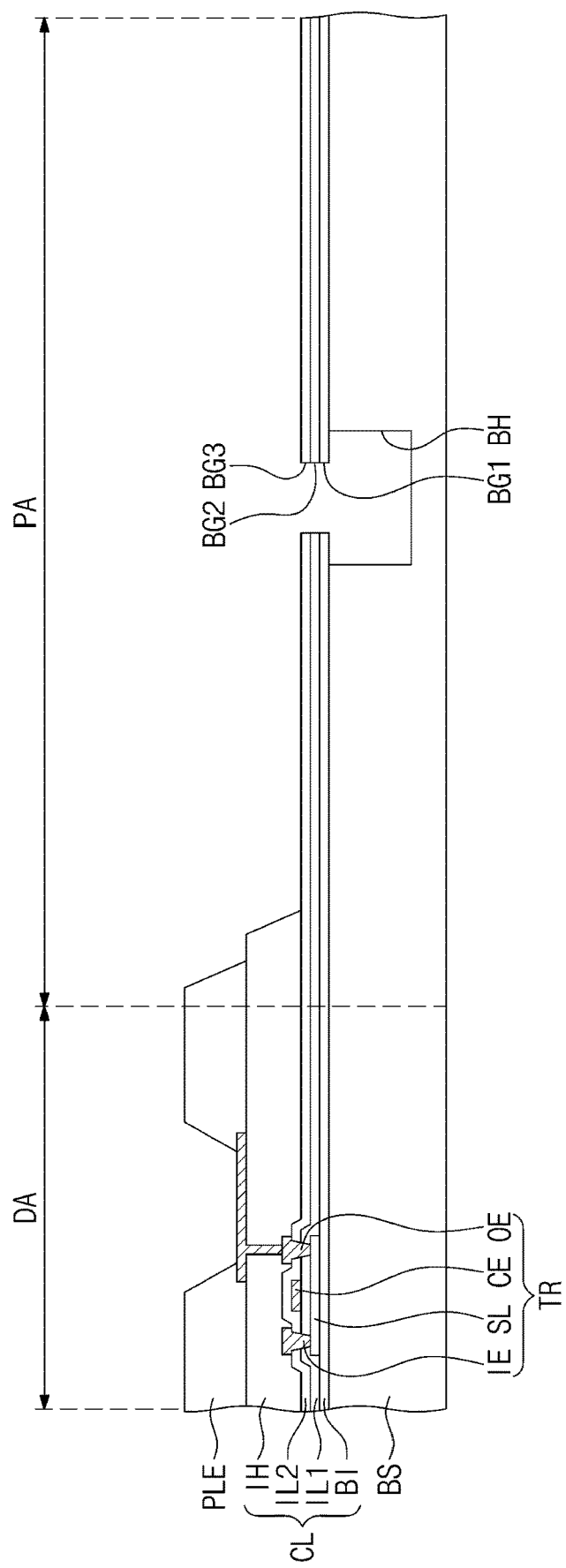
FIGS. 10A-10F are sectional views illustrating a method of fabricating a display panel, according to some embodiments of the inventive concept.

Referring to FIG. 10A, the barrier layer BI may be formed on the base substrate BS. The transistor TR may be formed on the barrier layer BI. The electrodes SL, CE, IE, and OE included in the transistor TR may be formed by patterning a conductive material. The electrodes SL, CE, IE, and OE may be spaced apart (or separated) from each other by (or between) the insulating layers IL1, IL2, and IH, and the semiconductor pattern SL, the input electrode IE, and the output electrode OE may be connected to each other through contact holes, which are defined in the insulating layers IL1 and IL2.

The first electrode E1 may be formed on the third insulating layer IH. The first electrode E1 may be formed by patterning a conductive material. The first electrode E1 may be connected to the output electrode OE through a contact hole, which is defined in the third insulating layer IH.

The pixel definition layer PLE including an organic material may be formed on the third insulating layer IH. The pixel definition layer PLE may be formed to define an opening exposing at least a portion of the first electrode E1.

The openings BG1, BG2, and BG3, which penetrate the barrier layer BI, the first insulating layer IL1, and the second insulating layer IL2, respectively, may be formed in the barrier layer BI, the first insulating layer IL1, and the second insulating layer IL2 overlapped with the hole region PA. The recessed region BH may be formed in a portion of the base substrate BS overlapped with the hole region PA. The openings BG1, BG2, and BG3 and the recessed region BH may be formed to have an under-cut structure, due to a difference in etch rate therebetween under a specific etching material.

Figure 10B:
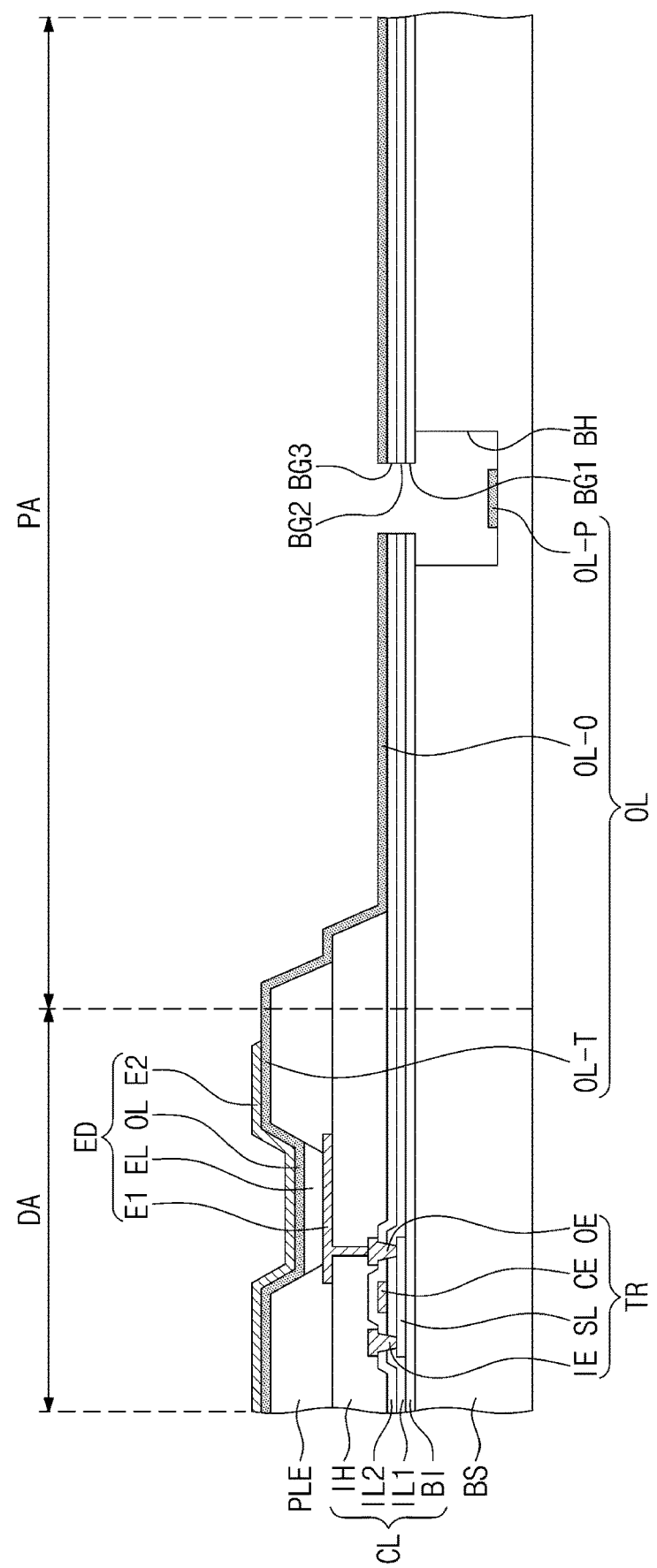

Next, referring to FIG. 10B, a light emitting layer EML, the charge control layer OL, and the second electrode E2, which constitute the organic light emitting element ED, may be formed on the pixel definition layer PLE by a deposition process. In some embodiments, the light emitting layer EML and the charge control layer OL may be defined as an organic layer containing an organic material. The organic layer and/or the second electrode E2 may be extended to the hole region PA and may be formed on the entire top surface of the base substrate BS. FIG. 10B illustrates an example, in which the second electrode E2 is formed in only the display region DA, but the inventive concept is not limited to this example. For example, the second electrode E2 may be formed on the entire top surface of the base substrate BS. The charge control layer OL may include the organic pattern OL-T, the first pattern OL-O, and the second pattern OL-P.

The first pattern OL-O and the second pattern OL-P may be spaced apart from each other by an under-cut structure, which is formed due to a difference in etch rate between the insulating layers BI, IL1, and IL2 and the base substrate BS, during a process of forming the charge control layer OL. For example, in a process of providing an organic material to form the charge control layer OL, the organic material may not be formed on a portion of a side surface of the recessed region BH of the base substrate BS, due to the under-cut structure. Thus, the first pattern OL-O and the second pattern OL-P may be disconnected from each other.

Because the second pattern OL-P is spaced apart from other portions of the charge control layer OL, the second pattern OL-P may block a diffusion path of moisture and oxygen, which is supplied from the module hole MH. Thus, it may be possible to improve reliability of the display panel DP.

Figure 10C:
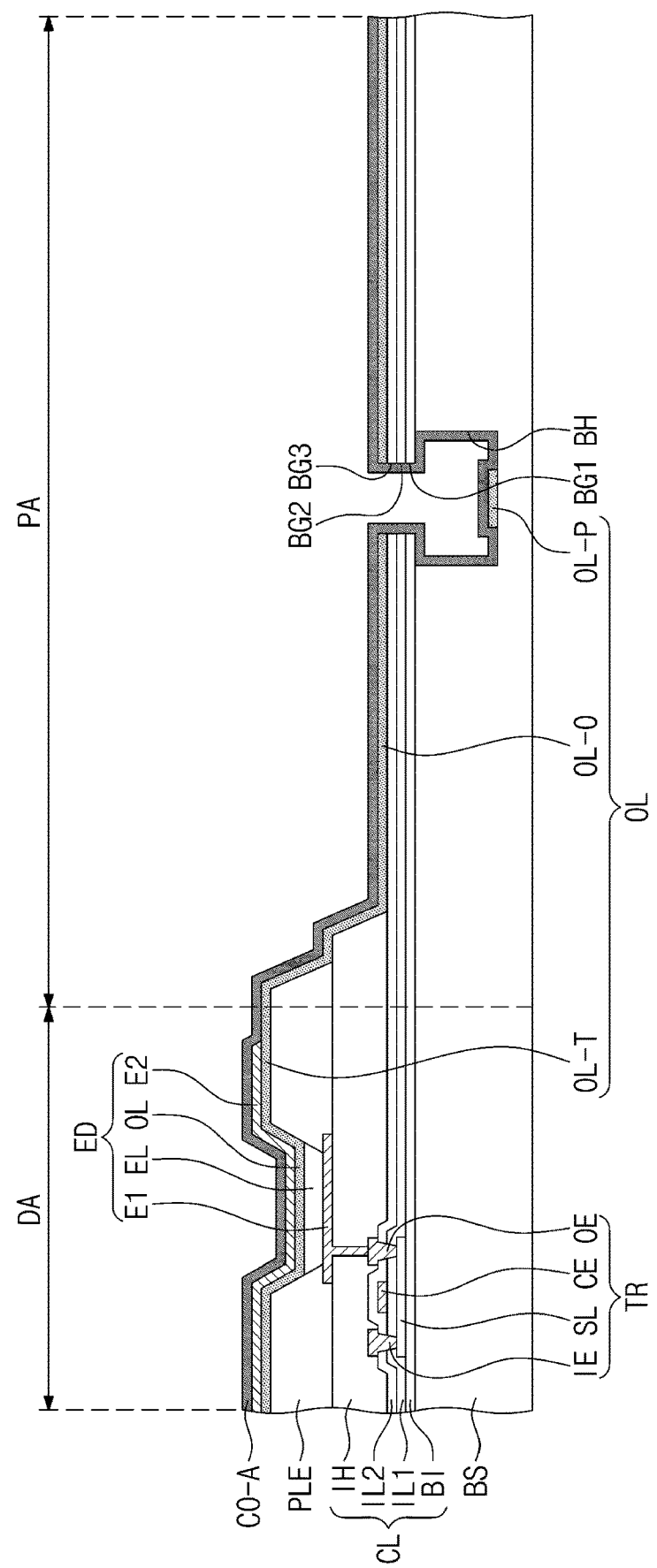
Figure 10D:
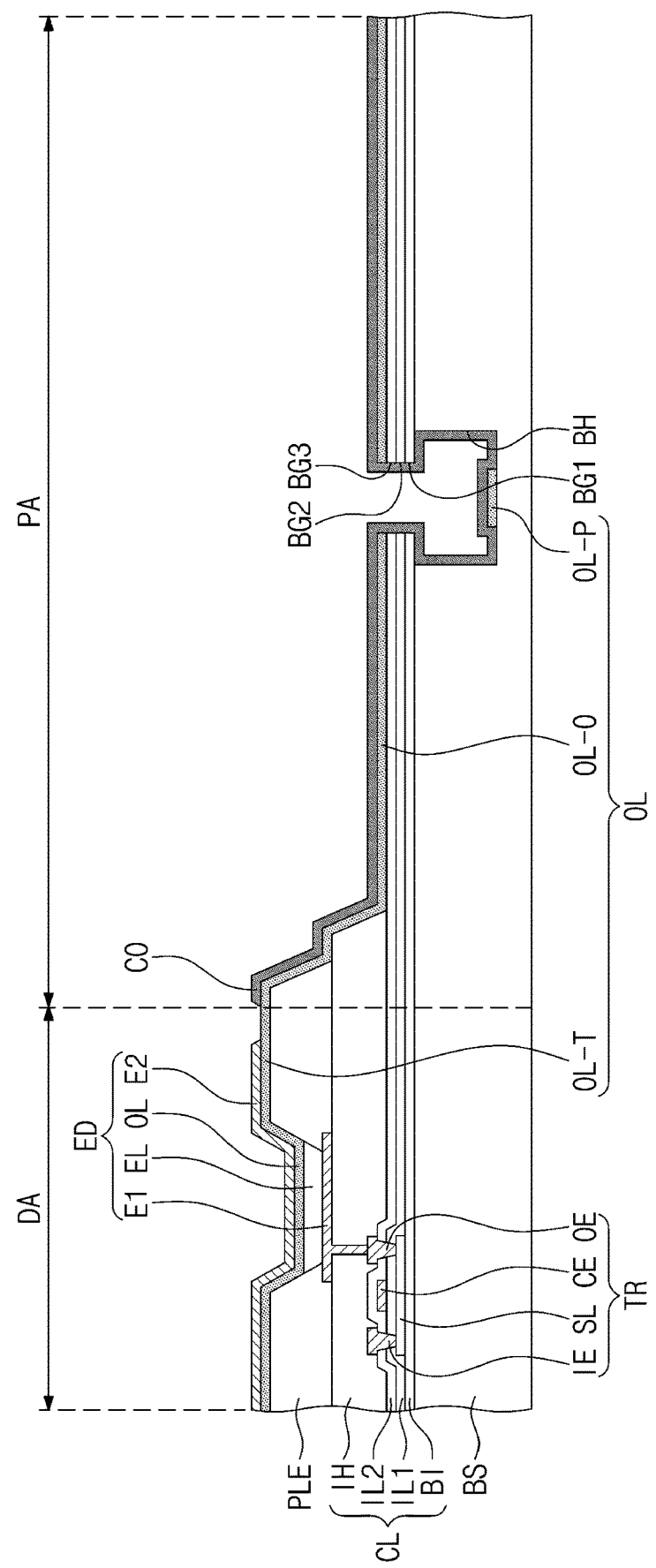

Next, referring to FIGS. 10C and 10D, an initial protection inorganic layer CO-A may be formed on the entire top surface of the base substrate BS. The initial protection inorganic layer CO-A may include an inorganic material. The initial protection inorganic layer CO-A may be formed to be in contact with the inner surface of the recessed region BH, the inner surface of each of the openings BG1, BG2, and BG3, and a portion of the rear surface of the barrier layer BI overlapped with the recessed region BH.

Next, the protection inorganic layer CO may be formed by a portion of the initial protection inorganic layer CO-A. The protection inorganic layer CO may be formed to be overlapped with the hole region PA. Thus, elements formed in the display region DA may be spaced apart from the protection inorganic layer CO.

Figure 10E:
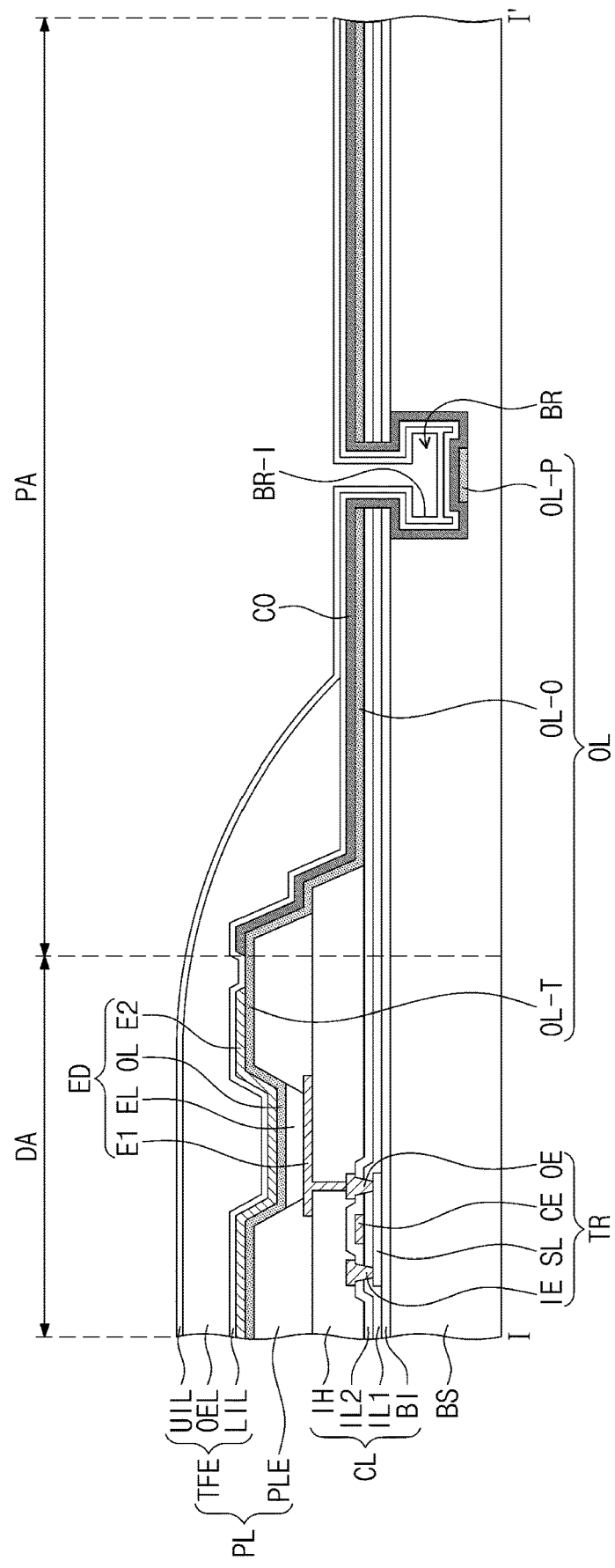

Next, referring to FIG. 10E, the first inorganic encapsulation layer LIL including an inorganic material may be formed on the display region DA and the hole region PA. Thereafter, the organic encapsulation layer OEL including an organic material may be formed on the first inorganic encapsulation layer LIL.

Next, the second inorganic encapsulation layer UIL including an inorganic material may be formed on the display region DA and the hole region PA. The first inorganic encapsulation layer LIL and the second inorganic encapsulation layer UIL may be formed to be in contact with each other on the hole region PA. The first inorganic encapsulation layer LIL may be formed to cover the entire top surface of the protection inorganic layer CO.

Figure 10F:
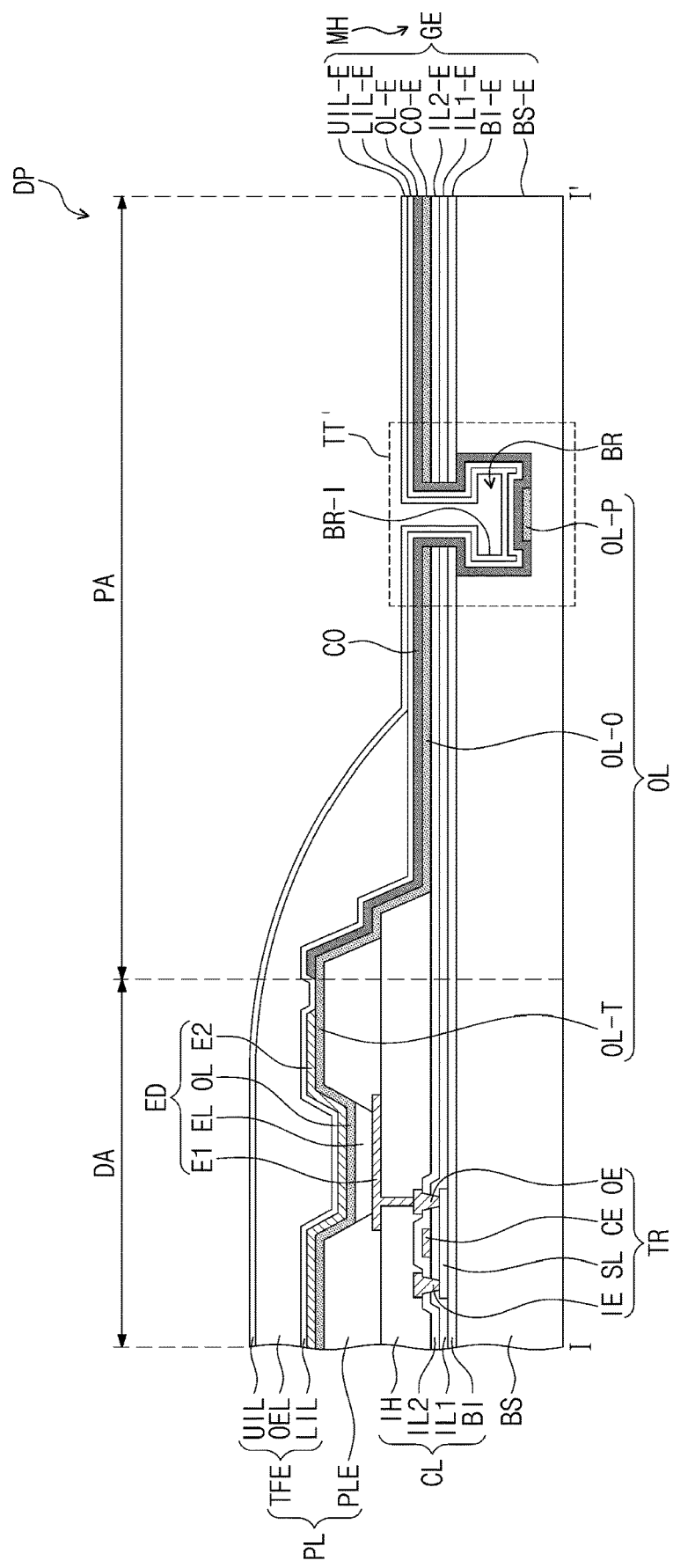

Next, referring to FIG. 10F, the module hole MH may be formed in a region, which is overlapped with the hole region PA of the display region DA. The module hole MH may be defined by the end portion BS-E of the base substrate, the end portion BI-E of the barrier layer, the end portion IL1-E of the first insulating layer, the end portion IL2-E of the second insulating layer, the end portion OL-E of the charge control layer, the end portion CO-E of the protection inorganic layer, the end portion LIL-E of the first inorganic encapsulation layer, and the end portion UIL-E of the second inorganic encapsulation layer, which constitute the inner surface GE.

According to some embodiments of the inventive concept, because the protection inorganic layer CO is additionally provided to cover the tip portion TP, the tip portion TP may be designed to have a robust structure. It may be possible to improve impact-resistance of the display panel DP.

Figure 11A:
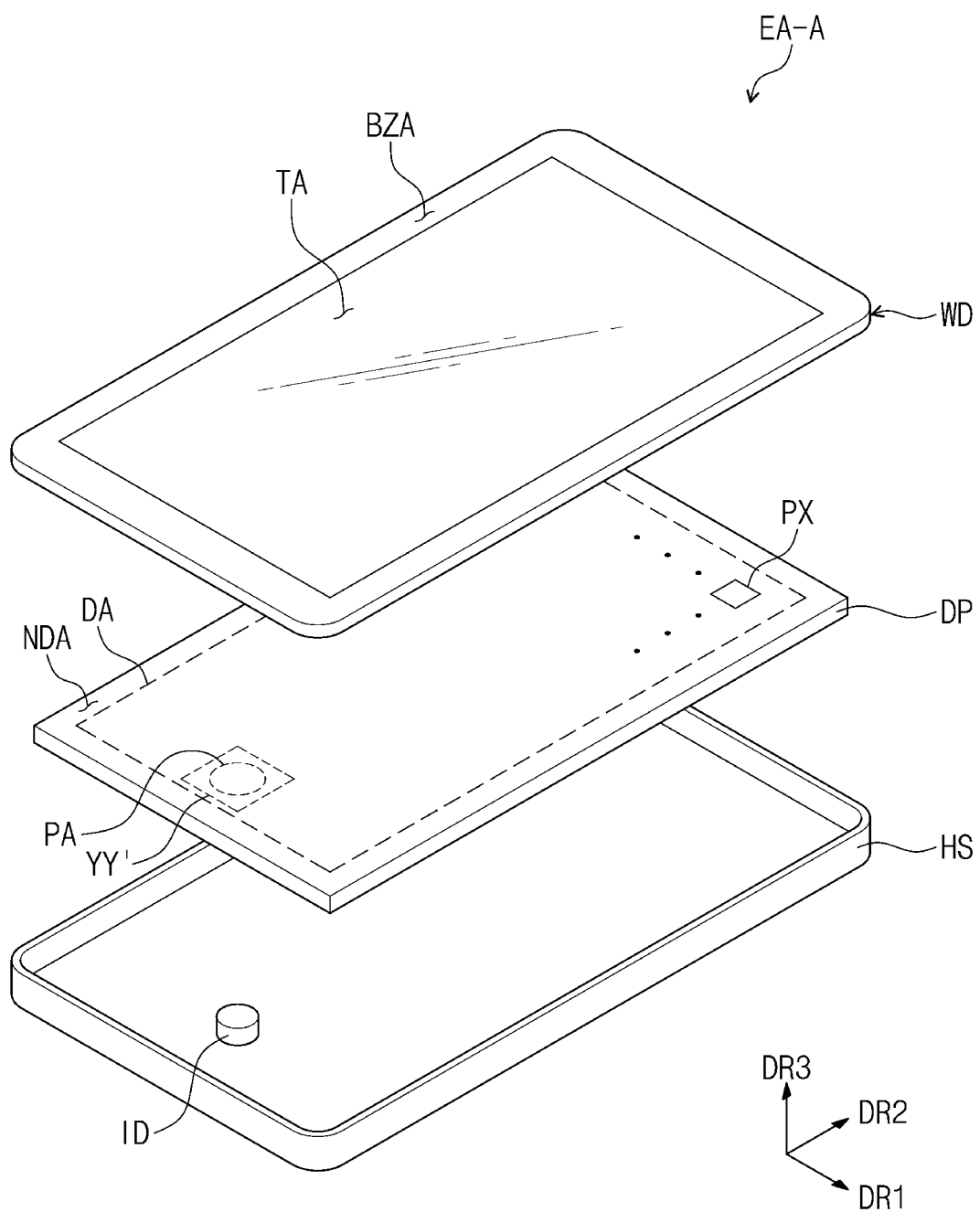
FIG. 11A is an exploded perspective view of an electronic device according to some embodiments of the inventive concept.
Figure 11B:
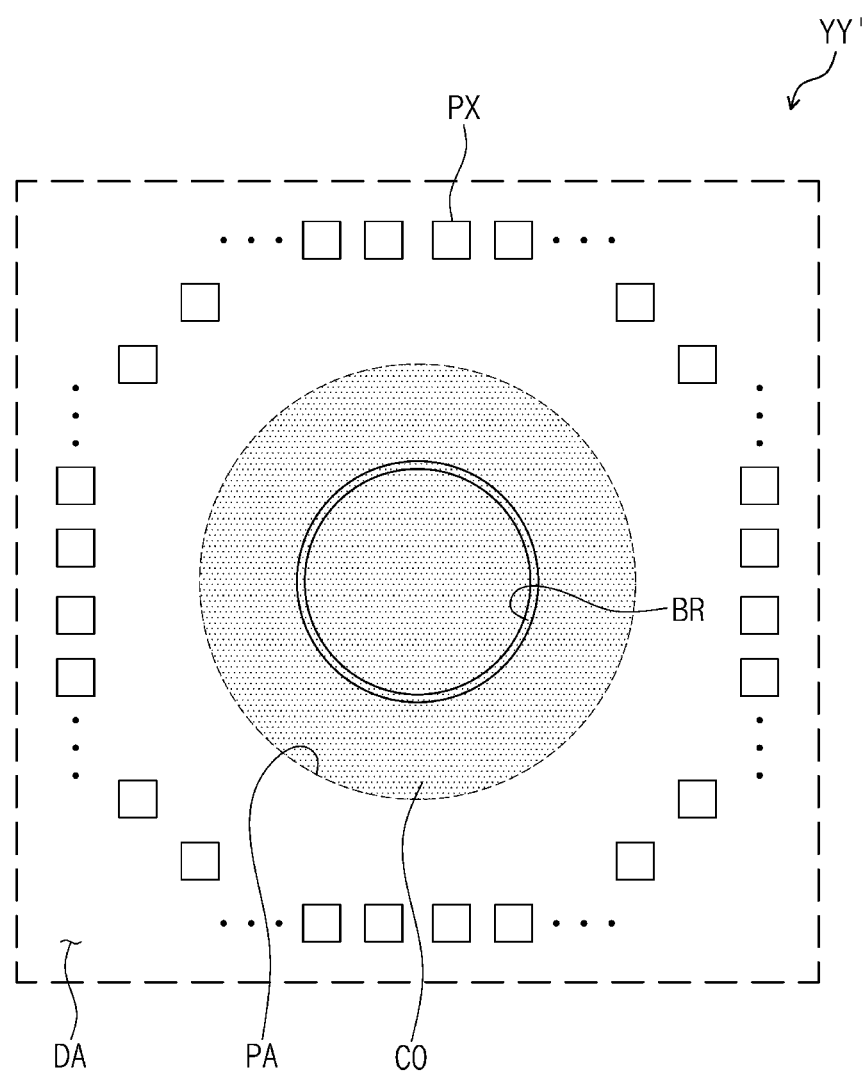
FIG. 11B is an enlarged view of a portion YY' of FIG. 11A.

FIG. 11A is an exploded perspective view of an electronic device according to some embodiments of the inventive concept. FIG. 11B is an enlarged view of a portion YY' of FIG. 11A.

Referring to FIGS. 11A and 11B, an electronic device EA-A according to some embodiments of the inventive concept may not have the module hole MH of FIG. 2. In some embodiments, because the module hole MH, in which the electronic module ID is inserted, is not be formed in the display panel DP, it may be possible to increase an area of the display region DA.

Because the module hole MH is omitted, the pixel PX may be formed in the hole region PA. Interferential effects, which are applied to the electronic module ID by elements of the display panel DP and the pixel PX, may be reduced or minimized by forming all or some of elements overlapped with the hole region PA using a transparent material or by reducing a density of the light emitting pattern EL (e.g., see FIG. 5B) included in the pixel PX. In FIG. 11B, a shade region depicts a region, in which the protection inorganic layer CO is disposed.

In the electronic device EA-A according to some embodiments of the inventive concept, because the module hole MH is omitted from the hole region PA of the display panel DP overlapped with the electronic module ID, it may be possible to improve visibility of the display panel DP.

According to some embodiments of the inventive concept, a display panel is configured to prevent or reduce interference with an electronic module. Thus, even if the electronic module is provided in a display device, the display device may have a narrow bezel region.

In addition, it may be possible to easily prevent a device and so forth from being damaged by external moisture or oxygen. This may make it possible to improve reliability in process and usage of the display device.

In addition, according to some embodiments of the inventive concept, a protection inorganic layer may be provided to enclose a tip portion of a groove, and this may make it possible to improve an impact-resistant property of an electronic device.

While example embodiments of the inventive concept have been particularly shown and described, it will be understood by one of ordinary skill in the art that variations in form and detail may be made therein without departing from the spirit and scope of the attached claims, and equivalents thereof.

What is claimed is:

1. An electronic device, comprising:
a base substrate comprising a hole region, a display region enclosing the hole region, and a peripheral region adjacent to the display region, the hole region comprising a recessed region, at which at least a portion of the base substrate is recessed;
a circuit device layer comprising a transistor, the circuit device layer being on the base substrate, and a plurality of insulating layers, each of which has an opening overlapped with the recessed region;
a display element layer on the circuit device layer, the display element layer comprising an organic light emitting element comprising a first electrode connected to the transistor, a second electrode opposite to the first electrode, a light emitting pattern in the display region, and a charge control layer overlapped with the display and hole regions;
an encapsulation layer on the display element layer, the encapsulation layer comprising a first inorganic encapsulation layer, a second inorganic encapsulation layer, and an organic encapsulation layer between the first inorganic encapsulation layer and the second inorganic encapsulation layer;
a protection inorganic layer in the hole region and between the insulating layers and the first inorganic encapsulation layer; and
a module hole overlapped with the hole region and spaced apart from the recessed region, the module hole penetrating each of the base substrate, at least a portion of the insulating layers, the protection inorganic layer, a first pattern, the first inorganic encapsulation layer, and the second inorganic encapsulation layer,
wherein the charge control layer comprises an organic pattern, which is overlapped with the light emitting pattern and is between the first and second electrodes, the first pattern, which is disposed on one of the insulating layers overlapped with the hole region, and a second pattern, which is spaced apart from the first pattern and is disposed in the recessed region, and
wherein the protection inorganic layer covers the first pattern and the second pattern.

2. The electronic device of claim 1, wherein the protection inorganic layer is covered with the first inorganic encapsulation layer.

3. The electronic device of claim 1, wherein the first inorganic encapsulation layer and the second inorganic encapsulation layer comprise different materials from each other, and
wherein the protection inorganic layer comprises a same material as the second inorganic encapsulation layer.

4. The electronic device of claim 3, wherein the protection inorganic layer comprises silicon nitride ($SiN_X$), and
wherein the first inorganic encapsulation layer comprises silicon oxynitride ($SiO_XN_Y$).

5. The electronic device of claim 1, wherein the protection inorganic layer has a relatively low oxidation rate, compared with the first inorganic encapsulation layer.

6. The electronic device of claim 1, wherein the protection inorganic layer is not overlapped with the display region and is spaced apart from the light emitting pattern, when viewed in a plan view.

7. The electronic device of claim 1, wherein the second pattern exposes at least a portion of the recessed region, and
wherein the protection inorganic layer covers the portion of the recessed region exposed by the second pattern.

8. The electronic device of claim 1, further comprising a first groove, which is formed by covering an inner surface of each of the opening and an inner surface of the recessed region with the protection inorganic layer, the first inorganic encapsulation layer, and the second inorganic encapsulation layer.

9. The electronic device of claim 8, further comprising a second groove, which is spaced apart from the module hole with the first groove interposed therebetween, is formed by recessing a portion of the base substrate from a top surface of at least one of the insulating layers, and is covered with the protection inorganic layer and the first inorganic encapsulation layer,
wherein the second groove has an internal space filled with the organic encapsulation layer.

10. The electronic device of claim 9, further comprising a dam portion, which is disposed in at least one of regions between the first groove and the module hole and between the first groove and the second groove,
wherein the dam portion comprises a same material as one of the insulating layers.

11. The electronic device of claim 8, wherein the first groove has a closed-line shape enclosing the module hole.

12. The electronic device of claim 11, wherein at least one of the insulating layers, which is overlapped with the recessed region in a plan view and protrudes from the recessed region, is to be a tip portion, and
wherein the tip portion is covered with the protection inorganic layer.

13. The electronic device of claim 8, wherein the first groove and the module hole have shapes different from each other, when viewed in a plan view.

14. The electronic device of claim 1, wherein the recessed region comprises a bottom region and a side region connected to the bottom region, and
wherein the side region comprises a curved surface, whose distance from the insulating layers is non-linearly changed in a thickness direction of the base substrate.

15. The electronic device of claim 1, further comprising an electronic module, which is overlapped with the module hole and is below the base substrate,
wherein the electronic module comprises at least one of a sound output module, a light-emitting module, a light-receiving module, or a camera module.

16. An electronic device, comprising:
a base substrate comprising a hole region, a display region enclosing the hole region, and a peripheral region adjacent to the display region, the hole region comprising a recessed region, in which at least a portion of the base substrate is recessed;
a plurality of insulating layers on the base substrate, each of the insulating layers having an opening, which is defined in the hole region and is overlapped with the recessed region;

a pixel between the insulating layers, the pixel comprising an organic light emitting element comprising a first electrode, a second electrode opposite to the first electrode, a light emitting pattern in the display region, and a charge control layer overlapped with the display region and the hole region;

an encapsulation layer comprising a first inorganic encapsulation layer covering the pixel, a second inorganic encapsulation layer opposite to the first inorganic encapsulation layer, and an organic encapsulation layer between the first inorganic encapsulation layer and the second inorganic encapsulation layer; and a protection inorganic layer in the hole region and between the insulating layers and the first inorganic encapsulation layer, wherein the charge control layer comprises an organic pattern, which is overlapped with the light emitting pattern and is between the first and second electrodes, a first pattern on one of the insulating layers overlapped with the hole region, and a second pattern spaced apart from the first pattern and in the recessed region, and wherein the protection inorganic layer is covered with the first inorganic encapsulation layer.

17. The electronic device of claim 16, wherein the protection inorganic layer covers the first pattern and the second pattern.

18. The electronic device of claim 16, wherein the first inorganic encapsulation layer and the second inorganic encapsulation layer comprise different materials from each other, and wherein the protection inorganic layer comprises a same material as the second inorganic encapsulation layer.

19. The electronic device of claim 16, wherein the protection inorganic layer is not overlapped with the display region and is spaced apart from the light emitting pattern, when viewed in a plan view.

20. The electronic device of claim 16, further comprising a first groove, which is formed by covering an inner surface of each of the opening and an inner surface of the recessed region with the protection inorganic layer, the first inorganic encapsulation layer, and the second inorganic encapsulation layer.

21. The electronic device of claim 16, further comprising a module hole, which is overlapped with the hole region, is spaced apart from the recessed region, and penetrates each of the base substrate, at least a portion of the insulating layers, the protection inorganic layer, the first pattern, the first inorganic encapsulation layer, and the second inorganic encapsulation layer.

* * * * *